United States Patent
Shrivastava et al.

(10) Patent No.: US 9,455,275 B2
(45) Date of Patent: Sep. 27, 2016

(54) HIGH VOLTAGE SEMICONDUCTOR DEVICES

(71) Applicant: Infineon Technologies AG, Neubiberg (DE)

(72) Inventors: Mayank Shrivastava, Essex Junction, VT (US); Maryam Shojaei Baghini, Mumbai (IN); Cornelius Christian Russ, Diedorf (DE); Harald Gossner, Riemerling (DE); Ramgopal Rao, Mumbai (IN)

(73) Assignee: Infineon Techologies AG, Neubiberg (DE)

( * ) Notice: Subject to any disclaimer, the term of this patent is extended or adjusted under 35 U.S.C. 154(b) by 71 days.

(21) Appl. No.: 14/168,978

(22) Filed: Jan. 30, 2014

(65) Prior Publication Data

US 2014/0145265 A1 May 29, 2014

Related U.S. Application Data

(62) Division of application No. 12/868,434, filed on Aug. 25, 2010, now Pat. No. 8,664,720.

(51) Int. Cl.
| | |
|---|---|
| *H01L 27/12* | (2006.01) |
| *H01L 27/07* | (2006.01) |
| *H01L 29/06* | (2006.01) |
| *H01L 29/08* | (2006.01) |

(Continued)

(52) U.S. Cl.
CPC ....... *H01L 27/1211* (2013.01); *H01L 27/0727* (2013.01); *H01L 29/0619* (2013.01); *H01L 29/0634* (2013.01); *H01L 29/0847* (2013.01); *H01L 29/7831* (2013.01); *H01L 29/7835* (2013.01); *H01L 29/7836* (2013.01); *H01L 29/78624* (2013.01); *H01L 29/0696* (2013.01); *H01L 29/1033* (2013.01)

(58) Field of Classification Search
CPC ... H01L 27/12; H01L 27/1211; H01L 27/01; H01L 29/76; H01L 29/66; H01L 29/66795; H01L 29/785; H01L 29/7848; H01L 29/06; H01L 29/0649; H01L 27/088; H01L 27/0886
USPC ................ 257/347, 350, 401, 255, 369, 368
See application file for complete search history.

(56) References Cited

U.S. PATENT DOCUMENTS

| | | | |
|---|---|---|---|
| 4,639,761 A | 1/1987 | Singer et al. | |
| 5,346,835 A | 9/1994 | Malhi et al. | |

(Continued)

FOREIGN PATENT DOCUMENTS

WO 2013131908 A1 9/2013

*Primary Examiner* — Chuong A Luu
(74) *Attorney, Agent, or Firm* — Slater Matsil, LLP

(57) ABSTRACT

In one embodiment, the semiconductor device includes a first source of a first doping type disposed in a substrate. A first drain of the first doping type is disposed in the substrate. A first gate region is disposed between the first source and the first drain. A first channel region of a second doping type is disposed under the first gate region. The second doping type is opposite to the first doping type. A first extension region of the first doping type is disposed between the first gate and the first drain. The first extension region is part of a first fin disposed in or over the substrate. A first isolation region is disposed between the first extension region and the first drain. A first well region of the first doping type is disposed under the first isolation region. The first well region electrically couples the first extension region with the first drain.

30 Claims, 35 Drawing Sheets

(51) Int. Cl.
  *H01L 29/78* (2006.01)
  *H01L 29/786* (2006.01)
  *H01L 29/10* (2006.01)

(56) References Cited

U.S. PATENT DOCUMENTS

| | | |
|---|---|---|
| 5,498,554 A | 3/1996 | Mei |
| 5,512,495 A | 4/1996 | Mei et al. |
| 5,585,660 A | 12/1996 | Mei |
| 5,861,657 A | 1/1999 | Ranjan |
| 6,468,837 B1 | 10/2002 | Pendharkar et al. |
| 6,750,524 B2 | 6/2004 | Parthasarthy et al. |
| 6,884,686 B2 | 4/2005 | Pendharkar |
| 7,576,393 B2 | 8/2009 | Ono et al. |
| 2007/0012945 A1 | 1/2007 | Sugizaki |
| 2007/0259501 A1* | 11/2007 | Xiong et al. .......... 438/283 |
| 2007/0262386 A1 | 11/2007 | Gossner et al. |
| 2008/0029814 A1 | 2/2008 | Khalil |
| 2008/0067588 A1 | 3/2008 | Williams et al. |
| 2009/0001426 A1* | 1/2009 | Cheng ............ H01L 21/845 257/213 |
| 2009/0032859 A1* | 2/2009 | Zhu .................... 257/316 |
| 2010/0052057 A1 | 3/2010 | Chung et al. |
| 2012/0049279 A1 | 3/2012 | Shrivastava et al. |

\* cited by examiner

HIGH VOLTAGE SEMICONDUCTOR DEVICES

This application is a divisional of U.S. application Ser. No. 12/868,434, filed on Aug. 25, 2010 now U.S. Pat. No. 8,664,720, entitled "High Voltage Semiconductor Devices," which application is hereby incorporated herein by reference.

TECHNICAL FIELD

The present invention relates generally to semiconductor devices, and more particularly to high voltage semiconductor devices.

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits include field-effect transistors (FETs) such as metal oxide semiconductor (MOS) transistors.

One of the goals of the semiconductor industry is to continue shrinking the size and increasing the speed of individual FETs. To achieve these goals, planar fully depleted SOI devices, and non-planar devices such as fin FETs (FINFETs) or multiple gate transistors will be used in sub 32 nm transistor nodes. For example, FINFETs not only improve areal density but also improve gate control of the channel, which is a serious threat to scaling planar transistors.

However, besides high performance devices, which are typically low voltage circuits, other high voltage devices are essential for every technology. Example of high voltage devices include input/output devices. High voltage devices are traditionally produced using a thicker gate oxide, longer channel length, changing the doping etc. However, such options are not feasible in non-planar device technologies which require fixed design space to minimize process variations and reduce process complexities.

Accordingly, what is needed in the art are high voltage devices that are compatible with non traditional device architectures and design space while at the same time overcoming the deficiencies of the prior art.

SUMMARY OF THE INVENTION

In accordance with an embodiment of the present invention, a semiconductor device comprises a first source of a first doping type disposed in a substrate. A first drain of the first doping type is disposed in the substrate. A first fin is disposed between the first source and the first drain. A first gate is disposed over the first fin. A second fin intersects a region of the first fin between the first gate and the first drain.

In accordance with an alternative embodiment of the present invention, a semiconductor device comprises a first source of a first doping type disposed in a substrate. A first drain of the first doping type is disposed in the substrate. A first gate is disposed between the first source and the first drain. A first channel is disposed under the first gate. A first extension region of the first doping type is proximate the first drain. A first doped region of a second doping type is disposed in the substrate. The second doping type is opposite to the first doping type. The first extension region contacts the first doped region. The first doped region is electrically separated from the first channel by the first extension region.

In accordance with yet another embodiment of the present invention, a semiconductor device comprises a first source of a first doping type disposed in a substrate. A first drain of the first doping type is disposed in the substrate. A first gate region is disposed between the first source and the first drain. A first channel region is disposed under the first gate region. A first extension region of the first doping type is disposed between the first gate and the first drain. The first extension region is part of a first fin disposed in or over the substrate. A first isolation region is disposed between the first extension region and the first drain. A first well region of the first doping type is disposed under the first isolation region. The first well region electrically couples the first extension region with the first drain.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1f, illustrates of a FINFET SOI device in accordance with an embodiment of the invention, wherein FIG. 1a illustrates a top view and wherein FIGS. 1b-1f illustrate cross sectional views;

FIG. 3, which includes FIGS. 3a-3d, illustrates a planar SOI device in accordance with an embodiment of the invention, wherein FIG. 3a illustrates a top view and FIG. 3b-3c illustrate cross sectional views;

FIG. 6, which includes FIGS. 6a-6d, illustrates a bulk FINFET device in accordance with an embodiment of the invention, wherein FIG. 6a illustrates a top view and FIGS. 6b-6d illustrate cross sectional views;

FIG. 7, which includes

FIG. 8, which includes FIGS. 8a-8c, illustrates a bulk FINFET device in accordance with an alternative embodiment of the invention, wherein FIG. 8a illustrates a top view and FIGS. 8b and 8c illustrate alternative cross sectional views;

FIG. 9, which includes 9a-9c, illustrates a bulk FINFET having a plurality of gate lines in accordance with an embodiment of the invention, wherein

FIG. 10, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
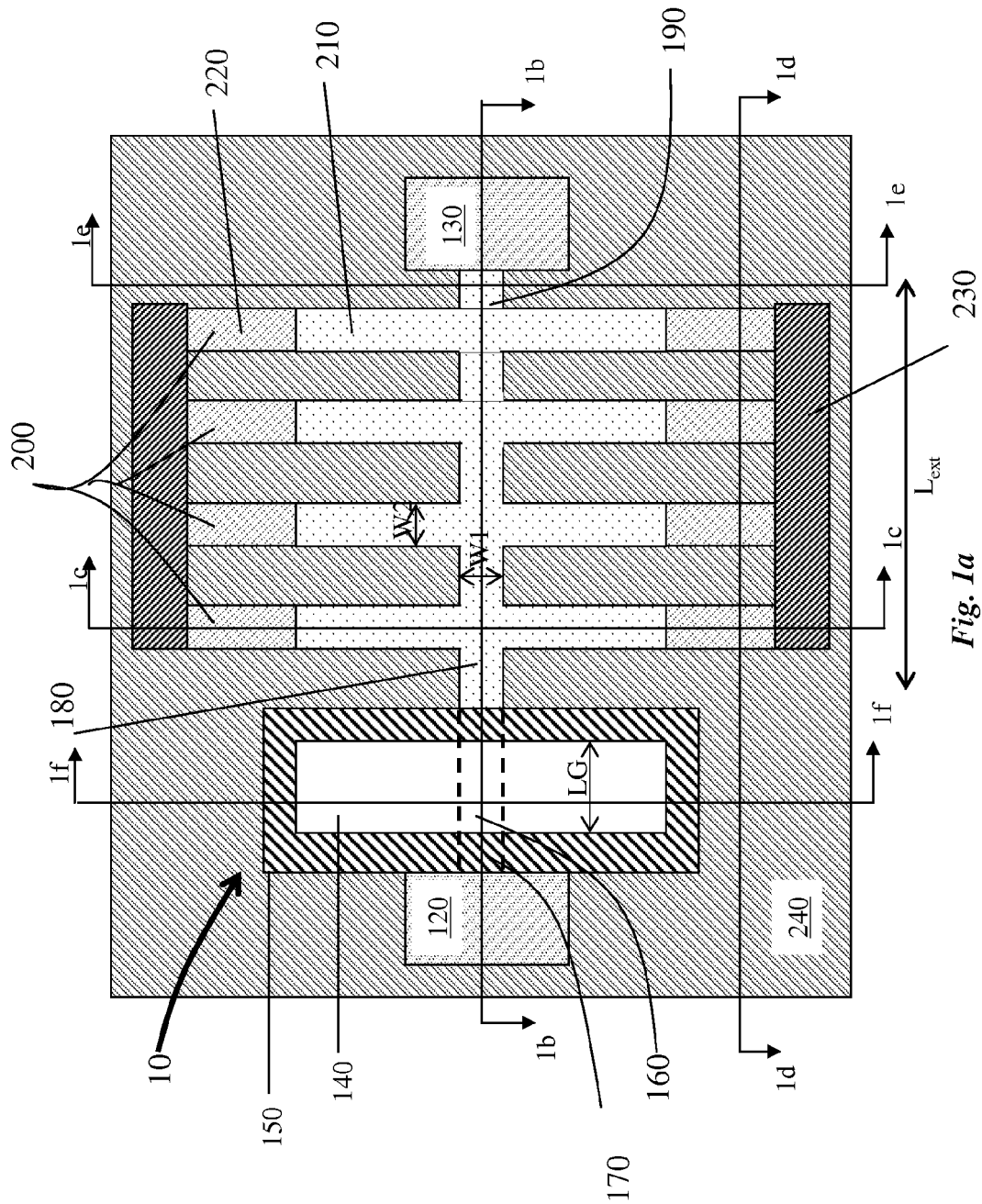

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Digital applications primarily drive CMOS scaling, in which the objectives are different—smaller, faster, and lower-power devices. Extremely scaled planar devices of about 30 nm are already in production, and further smaller devices are being explored. To maintain enough gate current control, these extremely scaled devices typically use ultra-thin gate oxides (1.5 nm or thinner) with heavily doped source and drain regions. However, such high performance devices operate at much lower voltages and are incompatible with higher operating voltages. Therefore, high voltage devices are separately fabricated for each technology.

While non-planar devices, such as multi gate devices or FINFET devices have been offered for future technologies to mitigate problems with scaling planar CMOS technologies, such multiple gate designs create challenges in designing and forming high voltage devices such as input/output devices.

Unlike planar technologies, where gate lengths and gate pitch can be substantially varied, the designs for non-planar devices offer little flexibility. For example, the fin height, width, and pitch are constant for a given technology due to the complexity of forming such a structure. Hence, the design space for MUGFET or FINFET devices is less flexible than the corresponding design space for planar devices. Therefore, introducing separate high voltage devices becomes more challenging with aggressively scaled non-planar devices. Non-planar devices may be fabricated in bulk wafer or in silicon on insulator (SOI) wafers.

Another option for deeply scaled devices includes planar fully depleted SOI devices. In a FD-SOI device, the gate depletion region extends through the entire thickness of the silicon layer such that the transistor operates in a fully depleted mode. Consequently, the silicon layer of the fully depleted SOI device is fully depleted before the threshold voltage is reached. Fully depleted SOI devices have an advantage over partially depleted transistors and bulk transistors in that they may be scaled to shorter gate lengths, and do not suffer from body effects due to the fact that the body is fully depleted during device operation. The absence of a neutral floating body minimizes the floating effects such as kink effects. Unlike the non-planar devices, FD-SOI devices may be fabricated using conventional techniques and hence easier to manufacture.

However, traditional means to incorporate high voltage devices (increasing gate oxide thickness, changing doping, increasing the drain extension length), either result in area penalty and/or increased drain resistance impacting performance.

Embodiments of the present invention overcome these and other challenges by incorporating multi-dimensional charge sharing effects to form devices compatible with standard process flow, with improved device performance (better ON state current without degrading breakdown voltage during the OFF state). As a consequence, embodiments of the invention improve performance of mixed signal ICs, which typically use many HV transistors.

One of the challenges in enabling high voltage operation is the need to avoid breakdown of the channel-drain junction, which will result in large leakage currents. Prior art methods employ a lightly doped region between the drain and channel regions of the transistor. This lightly doped region is also referred to as a drift region because of the conduction mechanism of the charges by an electric field only. Conventional methods to improve the high voltage handling capability rely upon increasing the length of the drift region to drop the high drain potential. However, such methods increase the penalty on drain resistance during ON state because parts of the drift region are not depleted (while improving the channel-drain breakdown voltage during the OFF state), which is unacceptable for many applications. Embodiments of the present invention improve the high voltage capability by using a multi-dimension approach without substantially increasing the drain resistance. In particular, embodiments of the invention use a multi-dimensional approach to reduce the high potential difference between the drain contact and the drain/channel junction, and thereby allow the switching of high drain voltages.

Only as an illustration, various embodiments are described below with respect to NMOS devices, however, alternative embodiments of the present invention also include PMOS devices. Also, any voltage potentials are reverted for PMOS devices. That is, a low reference potential becomes a high potential and vice versa.

Embodiments of high voltage FINFET devices fabricated on a SOI substrate will be described using FIGS. 1, 2, 5, and 12. Embodiments of HV planar devices fabricated on a SOI substrate will be described using FIGS. 3, 4, and 13. Embodiments of HV FINFET device fabricated on a bulk substrate will be described using FIGS. 6, 7, 8, 9, 10, 11, and 14.

FIG. 1, which includes FIGS. 1a-1f, illustrates of a FINFET SOI device in accordance with an embodiment of the invention, wherein FIG. 1a illustrates a top view and wherein FIGS. 1b-1f illustrate cross sectional views.

FIG. 1a illustrates a high voltage multi-gate transistor 10 having a source 120, a drain 130. The multi-gate transistor comprises a lateral fin 190 connecting the source 120 with the drain 130, as illustrated in FIG. 1a. The lateral fin 190 is formed over the insulator layer 240 of the substrate 100, illustrated in FIG. 1e. The substrate 100 is a semiconductor on insulator (SOI) substrate.

Referring to FIG. 1a, the source 120 and the drain 130 may include a raised source/drain structure and are wider than a first width W1 of the lateral fin 190 enabling contact formation. The source 120 and the drain 130 are doped heavily with a first doping type in various embodiments, and having at least a peak active concentration of about $5\times10^{19}$ cm$^{-3}$, and typically at least $1\times10^{20}$ cm$^{-3}$.

Figure 1B:
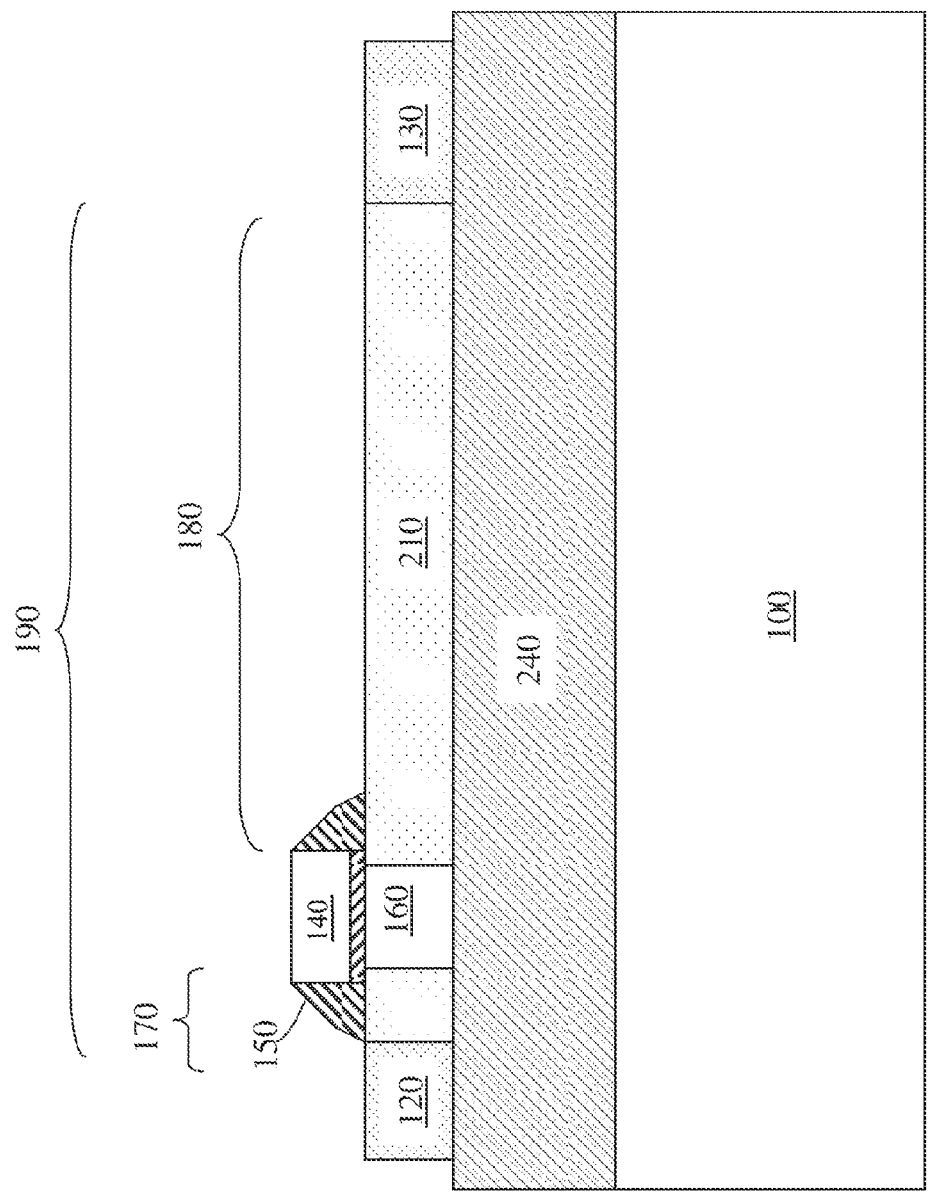
Figure 1C:
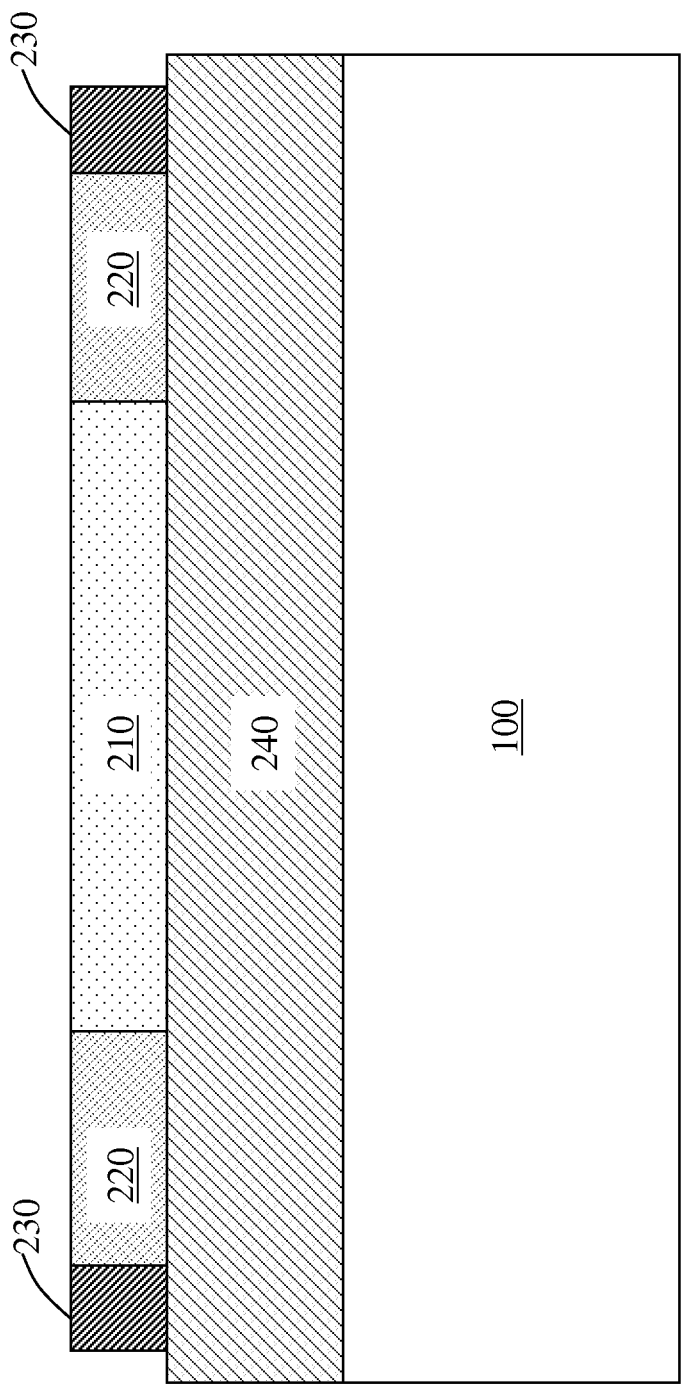
Figure 1D:
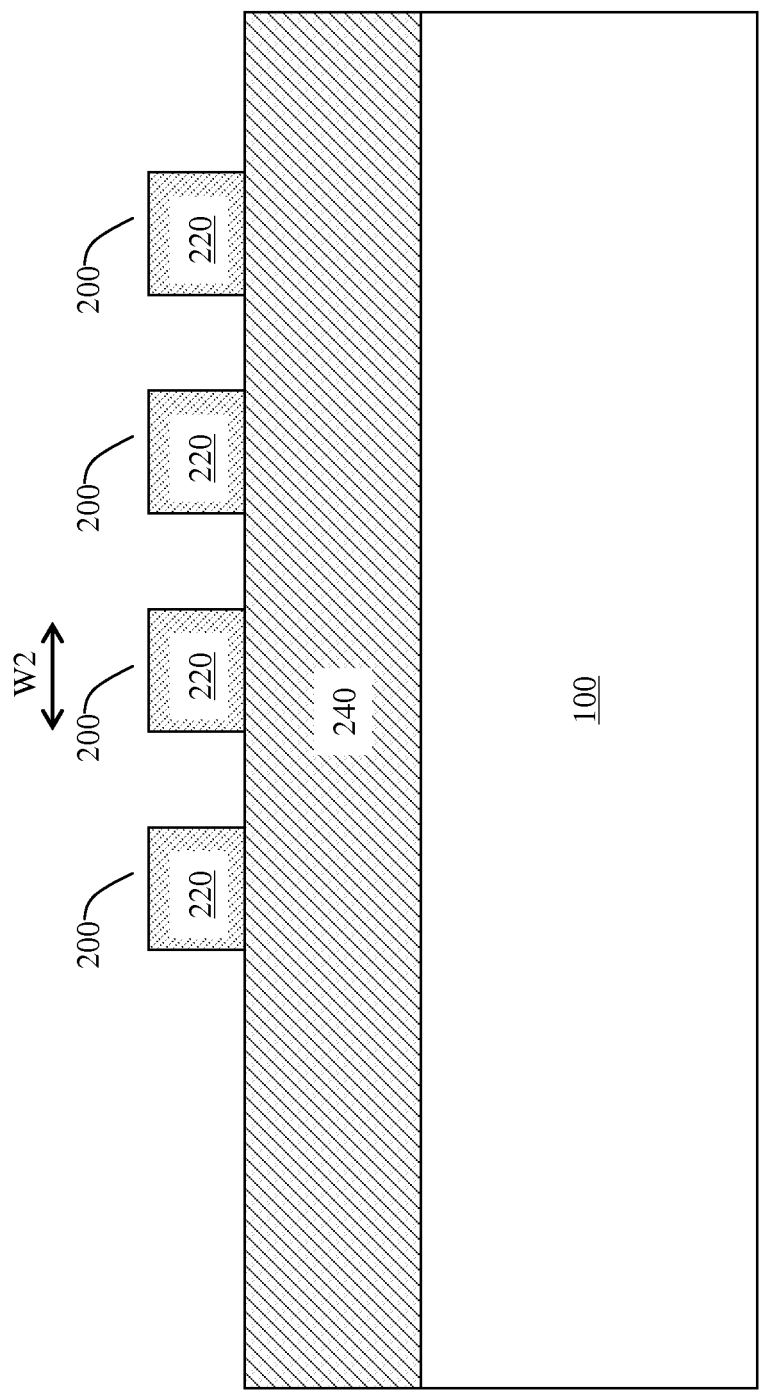
Figure 1E:
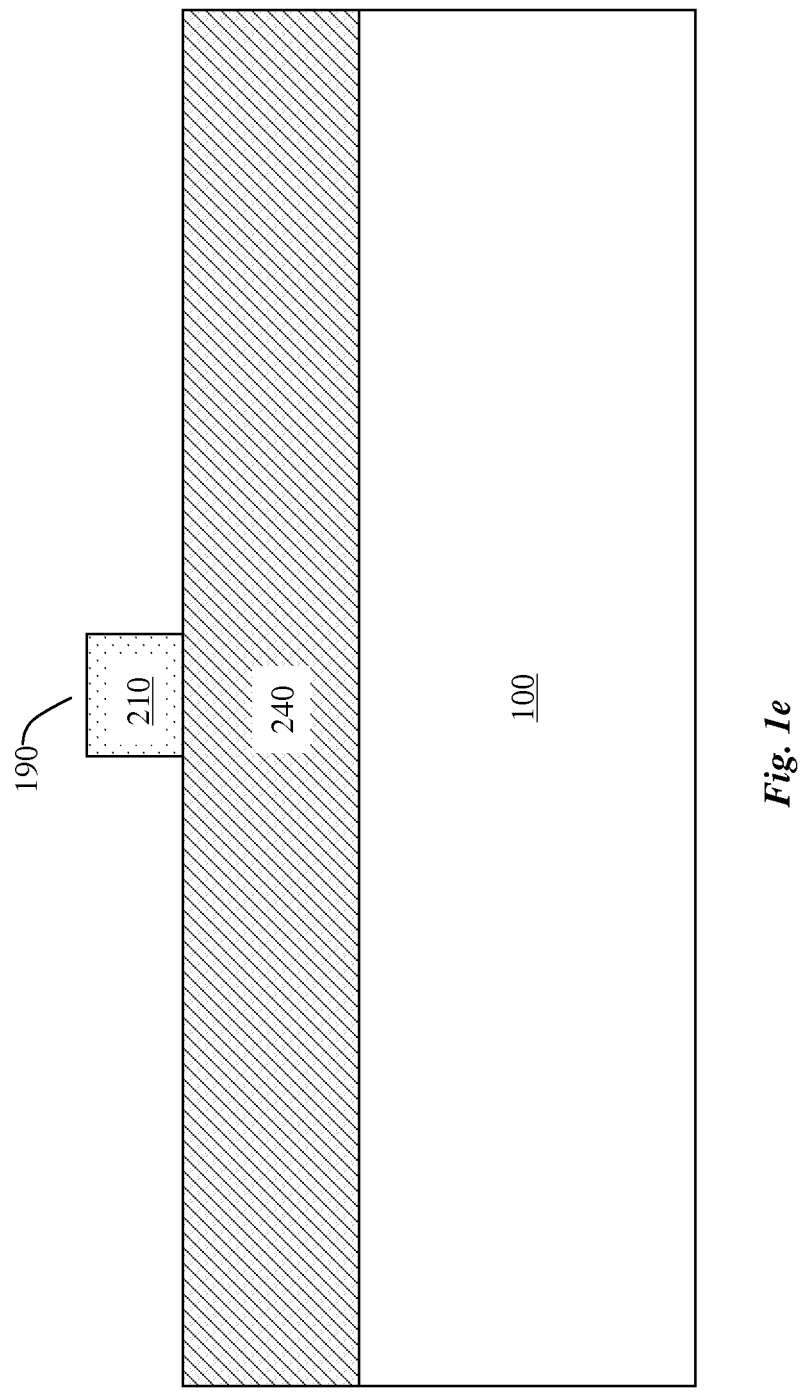
Figure 1F:
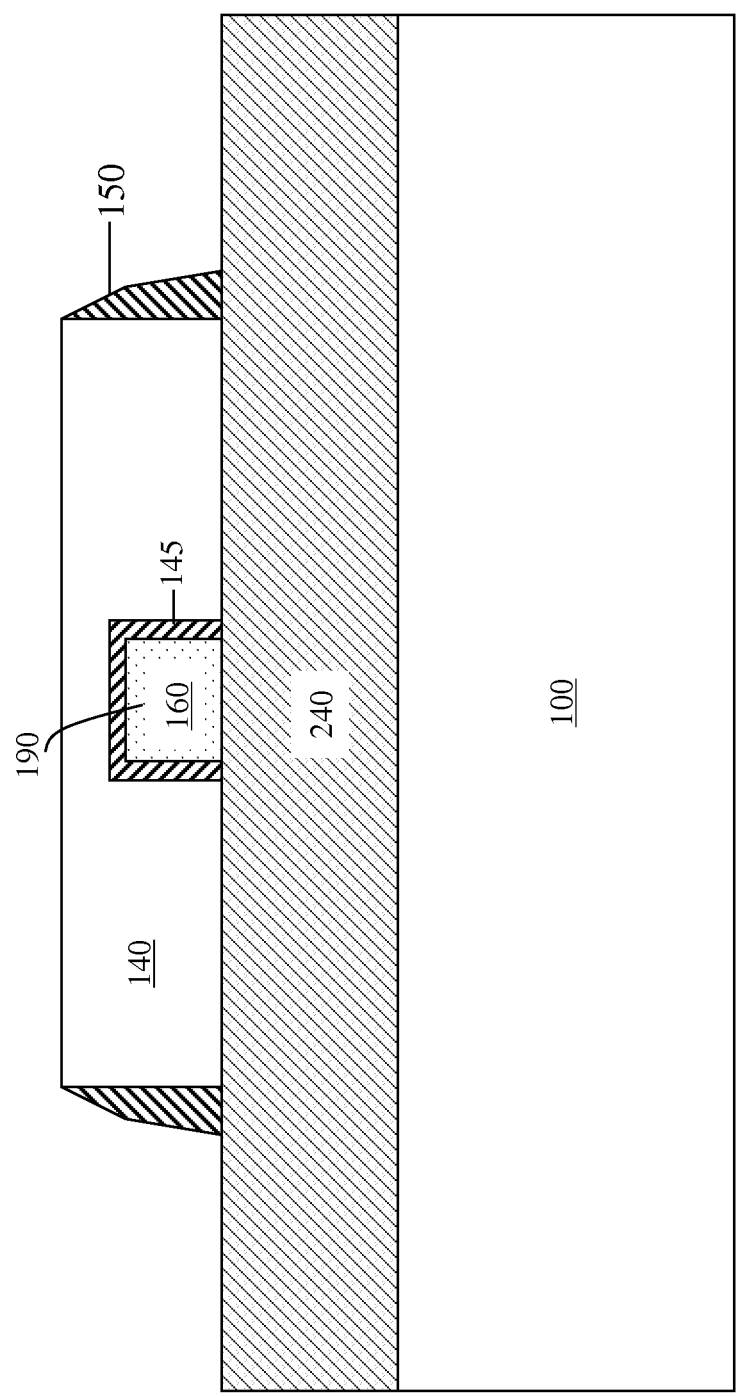

A gate line 140 wraps around the sidewalls and the top surface of the lateral fin 190 forming a channel 160 (FIG. 1f). In various embodiments, the channel 160 may be intrinsic or have a second doping type. The second doping type is opposite to the first doping type. Embodiments of the invention include both NMOS and PMOS devices. Therefore, the first doping type may be n or p type in various embodiments. As an example, for NMOS devices, the first doping type is n-type and the second doping type is p-type. Doping as used in this document refers to the net doping and not the doping a particular dopant.

As illustrated in FIG. 1f, a gate dielectric 145 wraps around the sidewalls and the top surface of the lateral fin 190. The gate line 190 wraps around the gate dielectric 145.

In various embodiments, as illustrated in FIG. 1f, the channel 160 is formed on all the three surfaces of the lateral fin 190 thereby forming a triple gate device. In case of a double gate device, the gate dielectric 145 is separated from the top surface of the lateral fin 190 by another insulating layer so that the top surface is not coupled to the gate line 190. In an alternate double gate device embodiment, the channel 160 is formed only on the two opposite sidewalls of the lateral fin 190.

The gate line 140 is electrically coupled to a gate potential node through a contact (not shown). Cross sectional views of the gate line 190 are illustrated in FIGS. 1b and 1f. The source region 120 is electrically separated from the gate line 140 by a spacer 150. The spacer 150 surrounds the gate line 140 as illustrated in FIG. 1a and the cross sectional view of FIG. 1b. The spacer 150 may comprise a plurality of thin insulating layers comprising, for example, oxides and nitrides. In one embodiment, the spacer 150 comprises an oxide layer. In another embodiment, the spacer 150 comprises a layer of oxide and a layer of nitride.

Referring next to FIGS. 1a and 1b, the lateral fin 190 is disposed between the source 120 and the drain 130. The lateral fin 190 comprises a first portion (a source extension region 170), a second portion (channel 160), and a third portion (drain extension region 180). The source extension region 170 is disposed under the spacer 150 between the gate line 140 and the source 120. The source extension region 170 is lightly doped and may be doped by dopants diffusing out of the source 120 into the lateral fin 190. Alternatively, the source extension region 170 may be doped with an implant. The drain extension region 180 is lightly doped, and may be doped separately, e.g., using an implant, or by in-diffusion from the surface, or it may also be doped together with the source extension region 170.

The thickness of the selected spacer 150 also determines the thickness of the source extension region 170, and hence the overlap with the gate line 140. Therefore, for a given process (implant/activation/diffusion/anneal), the spacer 150 controls the overlap capacitance.

The drain extension region 180 comprises a portion of a first lightly doped region 210. In various embodiments, the first lightly doped region 210 comprises a doping of less than $5\times10^{19}$ cm$^{-3}$, and typically from about $1\times10^{17}$ cm$^{-3}$ to about $5\times10^{18}$ cm$^{-3}$. The drain extension region 180 comprises a length $L_{ext}$.

A plurality of transverse fins 200 is disposed over the substrate 100 as illustrated in FIG. 1a (see also FIG. 1d). In various embodiments, the plurality of transverse fins 200 is oriented in a direction different from the orientation of the lateral fin 190. The plurality of transverse fins 200 are oriented perpendicular to the lateral fin 190 in one embodiment. In one embodiment, a second width W2 of the plurality of transverse fins 200 is about the same as the first width W1 of the lateral fin 190. The widths of the lateral fin 190 and the plurality of transverse fins 200 is identical to ensure process design compatibility. However, in other embodiments, the widths of the plurality of transverse fins 200 may be quantized differently depending on the process design restrictions.

The plurality of transverse fins 200 comprises a first portion (remaining portion of the first lightly doped region 210) and a second portion (second lightly doped region 220). The first lightly doped region 210 comprises a first doping type while the second lightly doped region 210 comprises a second doping type. Therefore, as illustrated in FIG. 1a, the first portion of the plurality of transverse fins 200 and the third portion of the lateral fin 190 form the first lightly doped region 210.

A first heavily doped region 230 having the second doping type is disposed over the substrate (see also FIG. 1c). The plurality of transverse fins 200 terminate at the first heavily doped region 230 such that a single first heavily doped region 230 is shared amongst the plurality of transverse fins 200 (FIG. 1a). Therefore, each of the second lightly doped regions 220 is coupled to the first heavily doped region 230. In various embodiments, the second portion (second lightly doped region 220) is optional and the first lightly doped region 210 may be directly coupled with the first heavily doped region 230.

Alternatively, the first heavily doped region 230 may be formed within each of the plurality of transverse fins 200. In such an embodiment, each second lightly doped region 220 may terminate at its respective first heavily doped region 230 within the respective fin of the plurality of transverse fins 200. Thus, a p-n junction is formed between the first and the second lightly doped regions 210 and 220.

The operation of the device in various embodiments is described herein. When the device is turned on by inverting the channel 160, a current flows from the source 120 to the drain 130. From the channel 160, the current flows through the drain extension region 180 comprising the first lightly doped region 210 having a length $L_{ext}$. Thus, the resistance of the drain is proportional to the length of the drain extension region 180 during the ON state. In various embodiments, the reduction of the high voltage is, however, a 2-D effect. (In the OFF state, the gate line 140 and the source 120 are grounded and the drain 130 is pulled up. In the ON state, the gate line 140 is pulled up.)

Because the first heavily doped region 230 is coupled to a low potential node, the p-n diode enables charge sharing within the plurality of transverse fins 200. In the absence of the p-n junction, the charge is shared primarily at the drain extension region 180 adjacent the gate line 140. However, because of charge sharing between the p-n junction and the channel-drain junction, part of the charge is moved into the plurality of transverse fins 200 thereby relaxing the electric field in the lateral fin 190 (thereby reducing the high voltage potential at the drain contact 190 to a lower value which the channel/drain junction can handle). This improved charge sharing relaxing the electric field at the junction between the first lightly doped region 210 and the channel 160. Thus, the breakdown voltage of the diode improves significantly while the transistor performance (ON state resistance) is not significantly impacted.

While not negligible, the resistance of the drain extension region 180 is much smaller than a device that uses a 1-D approach for reducing the potential. In various embodiments, the length $L_{ext}$ of the drain extension region 180 is at least 10× smaller than a comparable device (device having same breakdown voltage) using only the 1-D approach.

The total number of fins in the plurality of transverse fins 200 may be selected to achieve necessary potential reduction effect (diode breakdown voltage in OFF state). Using embodiments of the invention, a high voltage FINFET device can be fabricated without degrading the series resistance. Advantageously, in embodiments of the invention, device performance is decoupled with the reduction of the high drain potential adjacent the channel region. The device performance, for example, measured as the ON current is impacted by the source/drain resistance. The plurality of the transverse fins 200 reduce the drain potential without adding additional resistance to the flow current from the channel into the drain 130. Therefore, reduction in drain voltage can be achieved without incurring a penalty in device performance.

Advantageously, the p-n junction (diode) in the plurality of transverse fins 200 is physically separate from the channel 160. Hence, unlike a substrate or body contact, this diode has no direct impact on the inversion charge (besides the reduction in the drain voltage potential).

Figure 2:
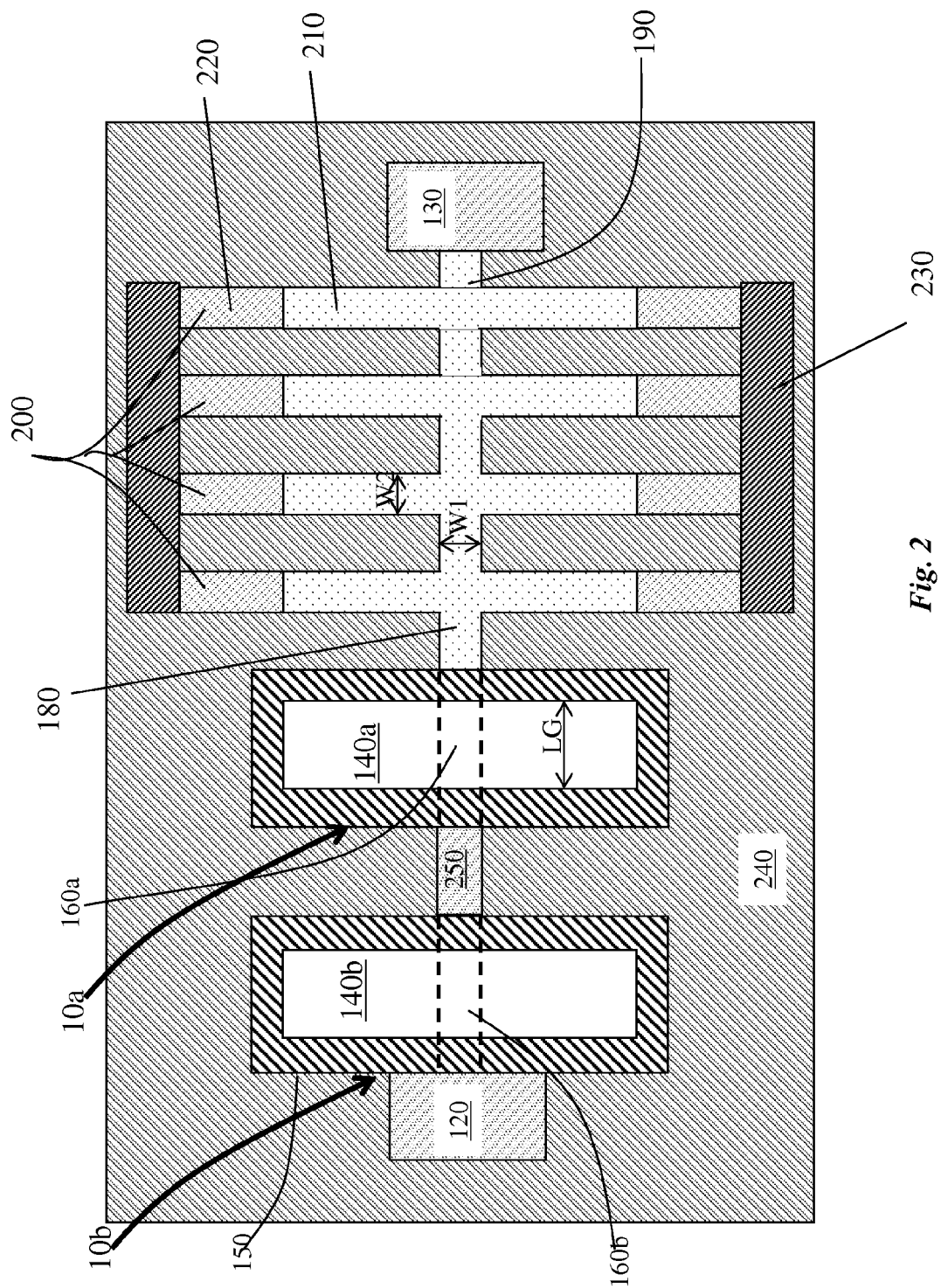
FIG. 2 illustrates an alternative embodiment of a FINFET SOI device having a plurality of gate lines.

FIG. 2 illustrates an alternative embodiment of a FINFET SOI device having a plurality of gate lines. While only two gates are illustrated, in various embodiments, many number of gate lines may be added for coupling further transistors in series.

Referring to FIG. 2, instead of a single gate line, a first gate line 140a and a second gate line 140b form a first and a second transistor 10a and 10b having a first channel 160a and a second channel 160b. The first and the second transistors 10a and 10b have a common shared source/drain 250. The shared source/drain 250 is a drain for the second transistor 10b, and a source of the first transistor 10a. Because the potential at the drain of the first transistor 10a is already lowered by the p-n junction in the plurality of transverse fins 200, additional measures for potential reduction within the shared source/drain 250 are not required.

Figure 3A:
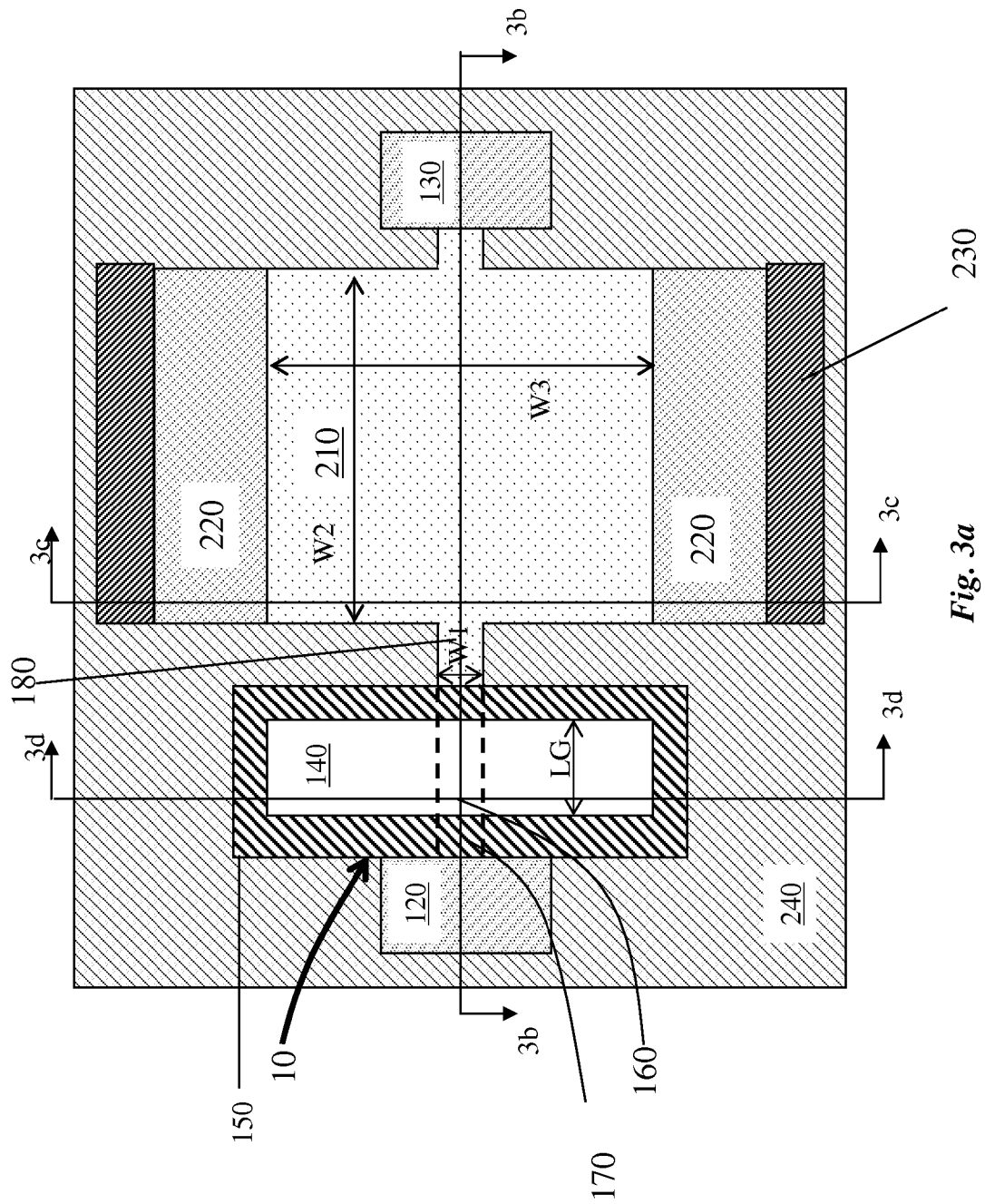
Figure 3B:
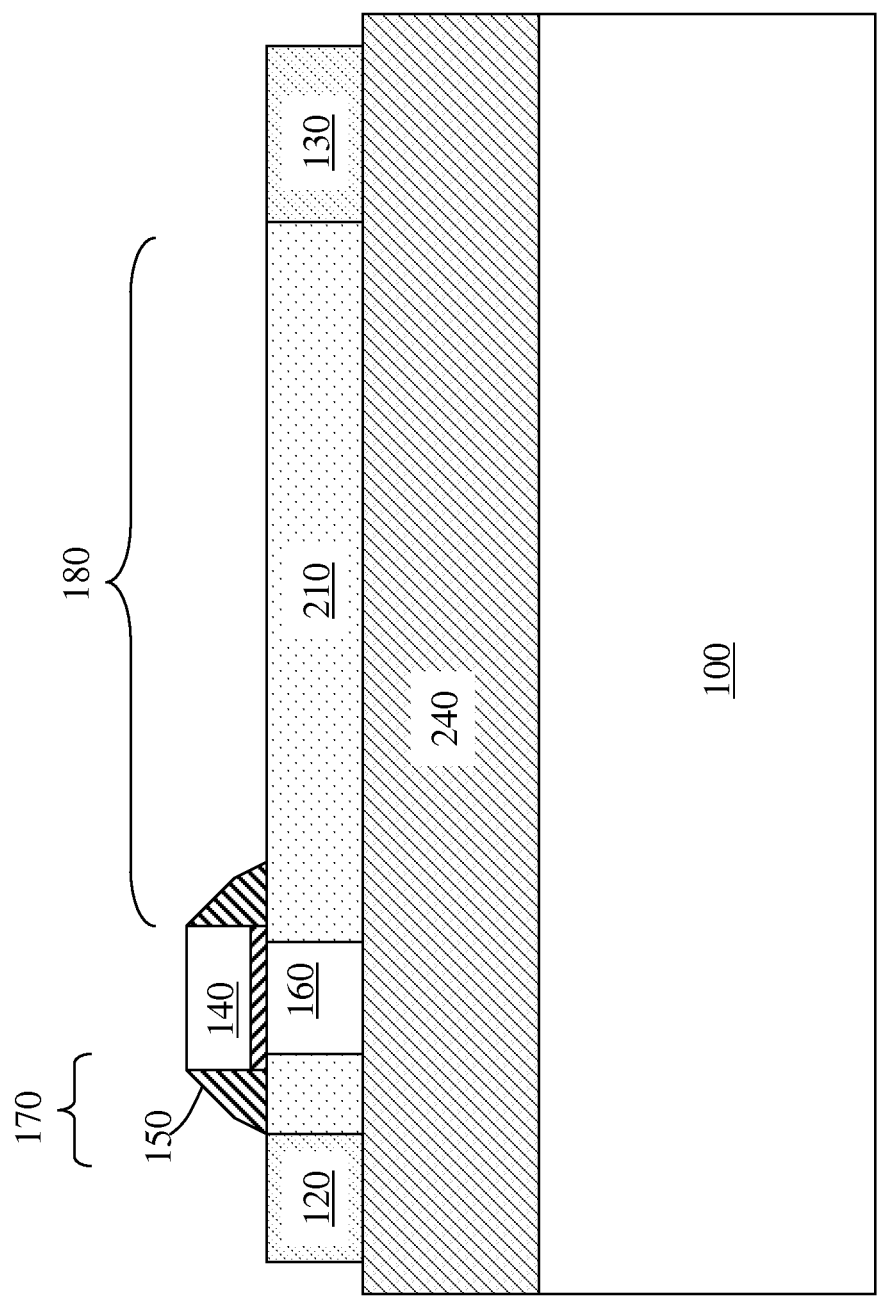
Figure 3C:
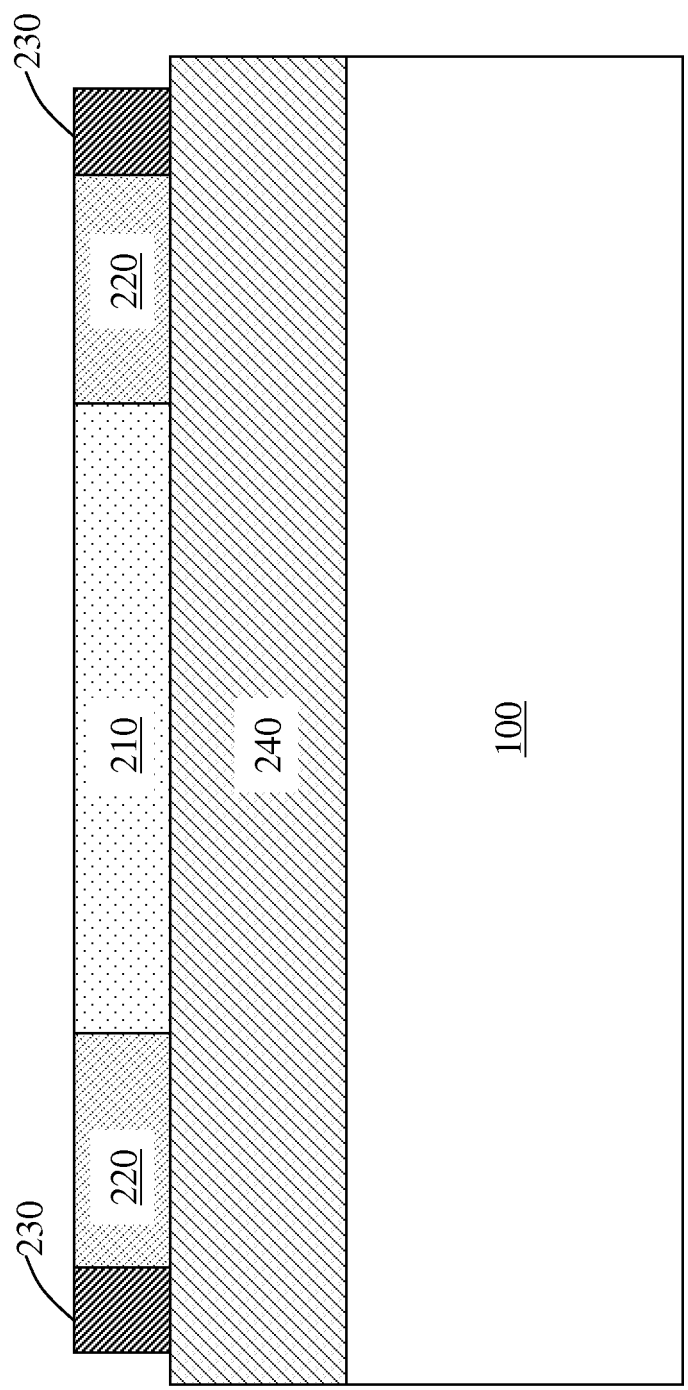
Figure 3D:
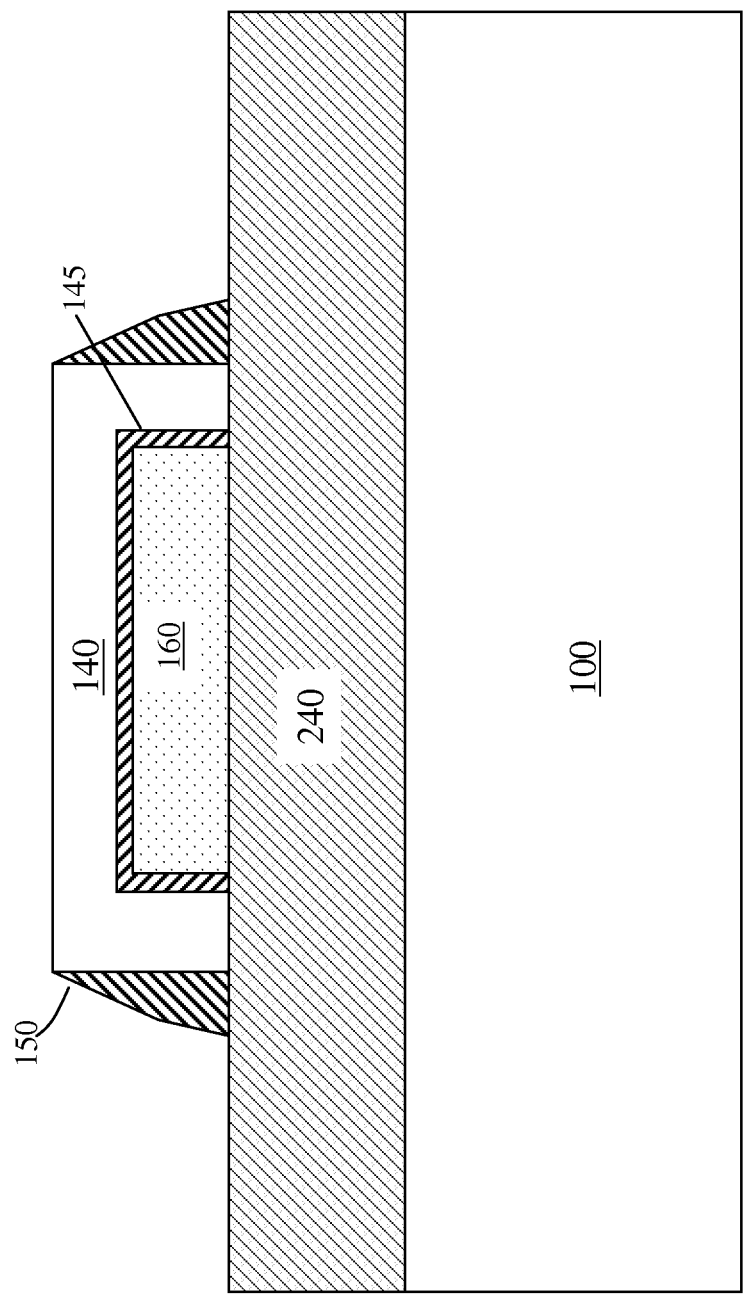

FIG. 3, which includes FIGS. 3a-3d, illustrates a planar SOI device in accordance with an embodiment of the invention, wherein FIG. 3a illustrates a top view and FIG. 3b-3c illustrate cross sectional views.

Referring to FIG. 3a, a planar transistor 10 comprises a source 120 and a drain 130 coupled through a channel 160. A gate line 140 is disposed over the substrate 100 (see also FIG. 3d). The transistor 10 includes source extension region 170 and drain extension region 180. A p-n junction is formed between first and second lightly doped regions 210 and 220 as in prior embodiments. The second lightly doped region 220 is coupled to the first heavily doped region 230 as illustrated in FIG. 3a.

Unlike prior embodiments, the drain extension region 180 does not include any fins. Rather, a second width W2 of the drain extension region 180 is much larger than the first width W1 of the channel 160, which is also referred to as the first width W1 of the transistor 10. As illustrated in FIG. 3a, the channel 160 comprises a first width W1 along a first direction perpendicular to a second direction from the source 120 to the drain 130. The first drain extension region 180 comprises a first region having the first width W1 and a second region having a second width W2 and a third width W3. The first region of the first drain extension region 180 comprises the first width W1 along the first direction. The second region of the first drain extension region 180 comprises the second width W2 along the second direction and the third width W3 along the first direction. The second width and the third widths are larger than the first width. The cross section views of FIGS. 3b and 3c are similar to FIGS. 1b and 1c even though no fins are present in this embodiment. The width of the drain extension region 180 may be selected to ensure the appropriate reduction of the voltage adjacent the junction between the drain extension region 180 and the channel 160 and breakdown voltage.

Figure 4:
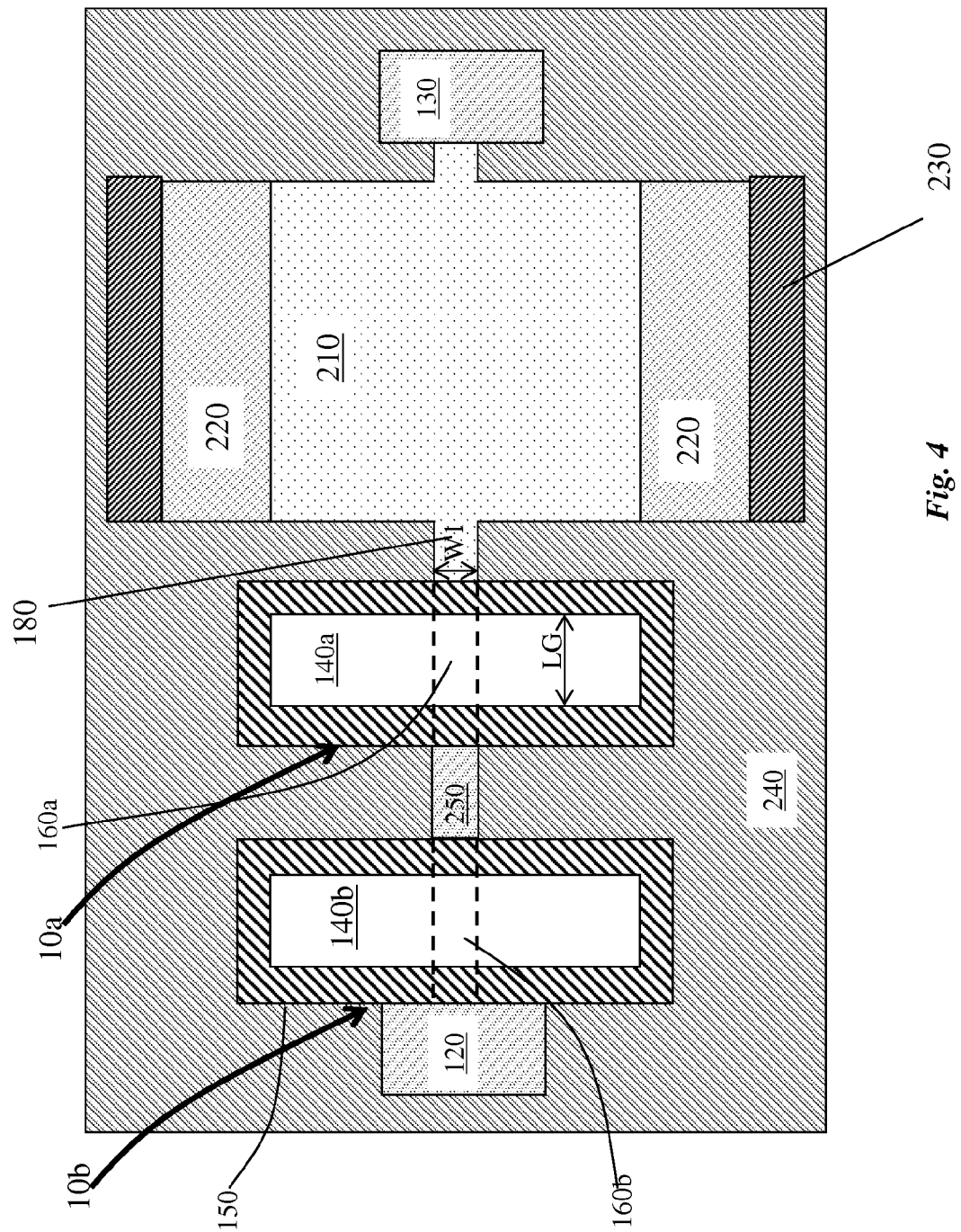
FIG. 4 illustrates a top view of a planar SOI device having a split gate in accordance with an embodiment of the invention.

FIG. 4 illustrates a top view of a planar SOI device having a split gate in accordance with an embodiment of the invention.

As illustrated in FIG. 4, a first gate line 140a and a second gate line 140b form a first planar transistor 10a and a second planar transistor 10b having a first channel 160a and a second channel 160b respectively. The first and the second transistors 10a and 10b have a common shared source/drain 250. The shared source/drain 250 is a drain for the second transistor 10b, and a source of the first transistor 10a. Because the potential at the drain of the first transistor 10a is already lowered by the p-n junction in the plurality of transverse fins 200, additional measures for potential reduction within the shared source/drain 250 are not required.

Figure 5:
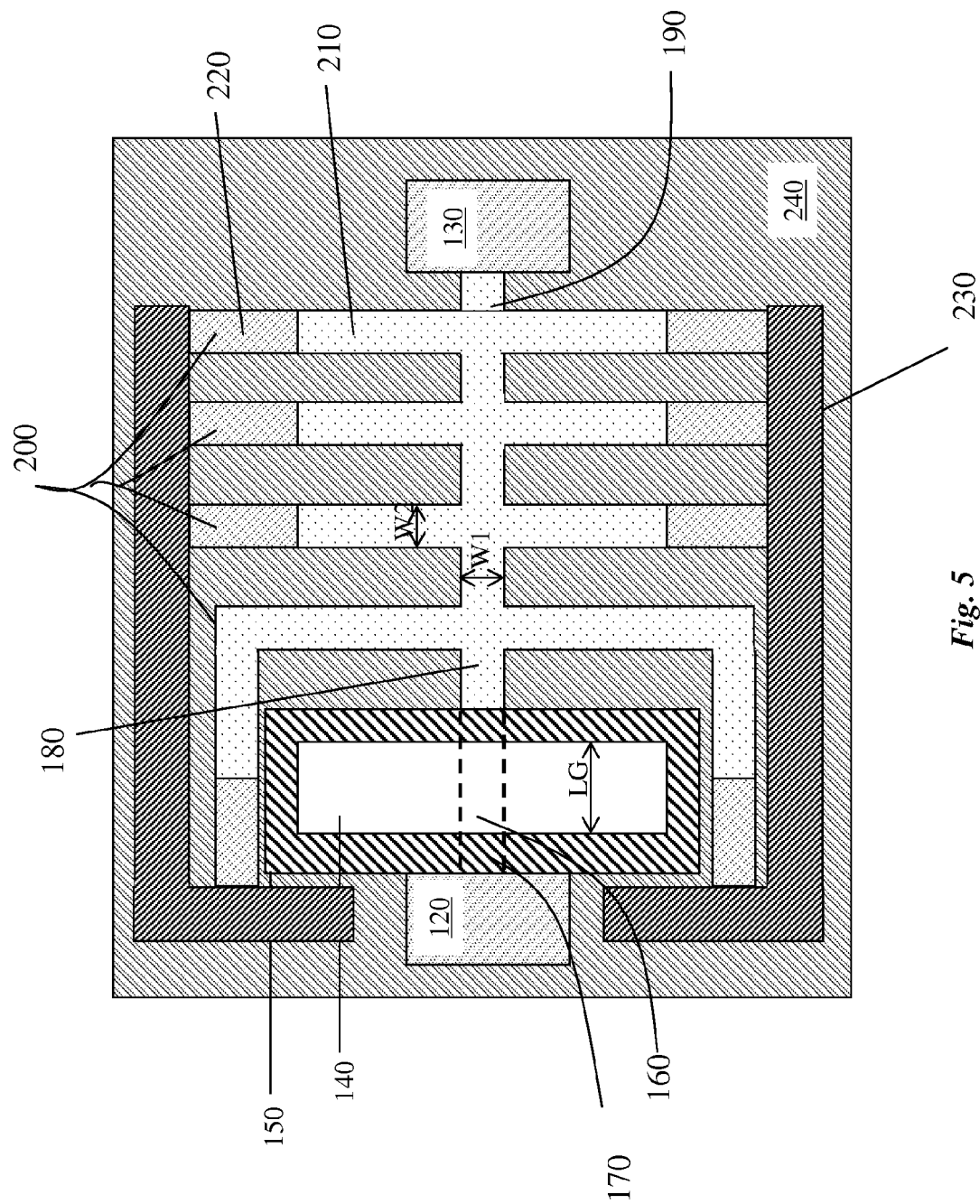
FIG. 5 illustrates a top view of an alternative embodiment of a FINFET SOI device.

FIG. 5 illustrates a top view of an alternative embodiment of a FINFET SOI device.

While prior embodiments illustrated that all fins of the plurality of transverse fins had the same length and were oriented in one direction, in various embodiments, each fin of the plurality of transverse fins 200 may be individually tailored to improve areal density (minimize layout area).

As illustrated in FIG. 5, some of the fins may wrap around the gate line 140 to use remaining area of the layout. This ensures maximum usage of area on the chip. In various embodiments, the length of the first and/or the second lightly doped regions 210 and 220 may be optimized.

Embodiments of the device include similar layout changes of the drain extension region 180 for the planar SOI device.

Figure 6A:
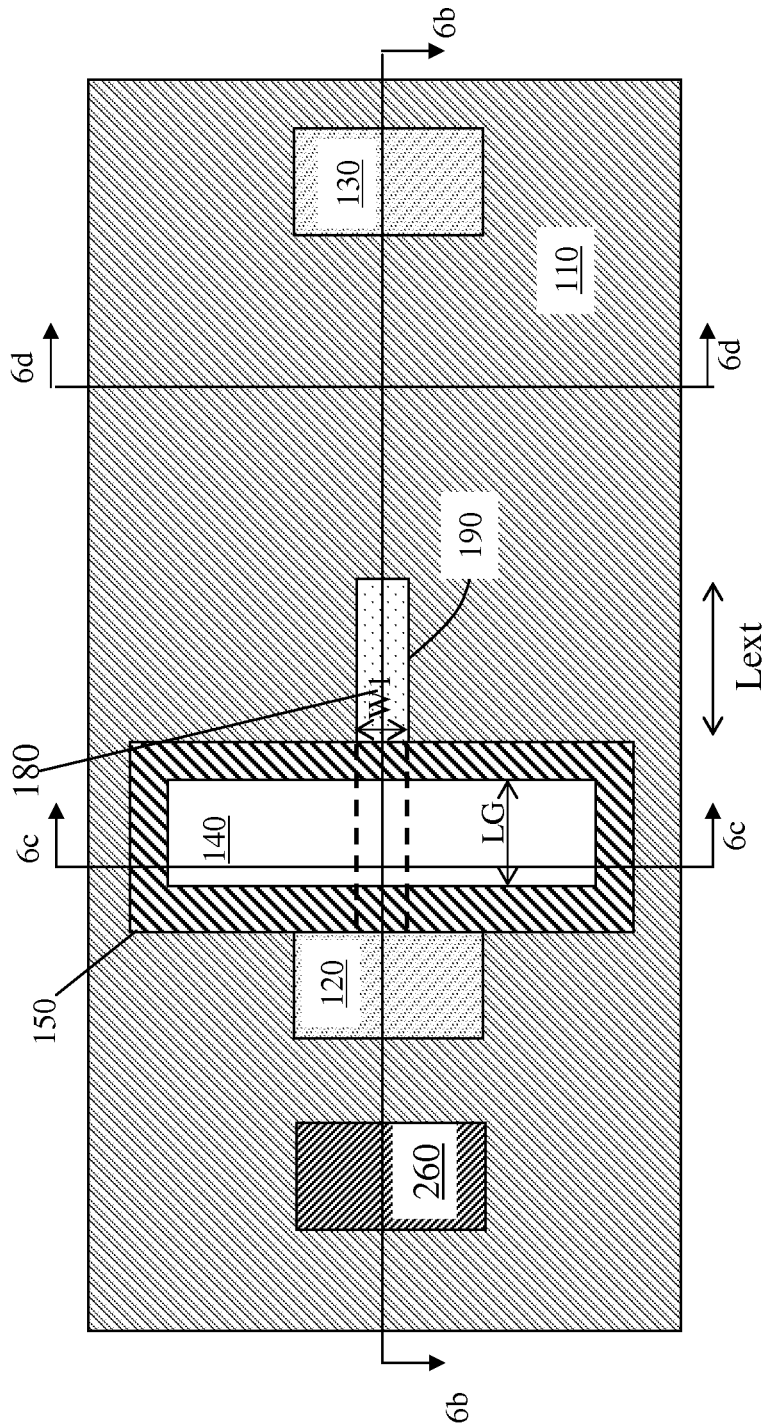
Figure 6B:
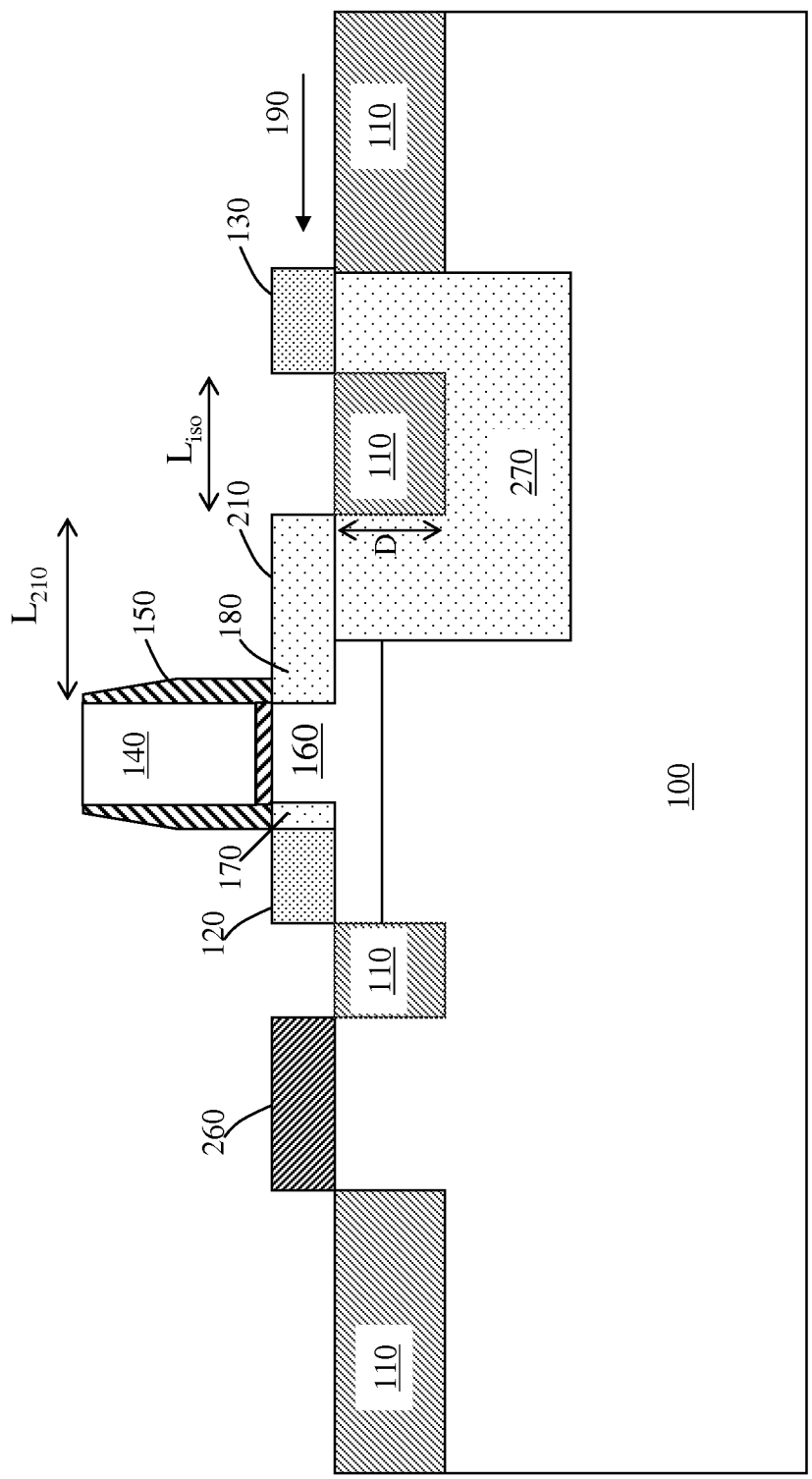
Figure 6C:
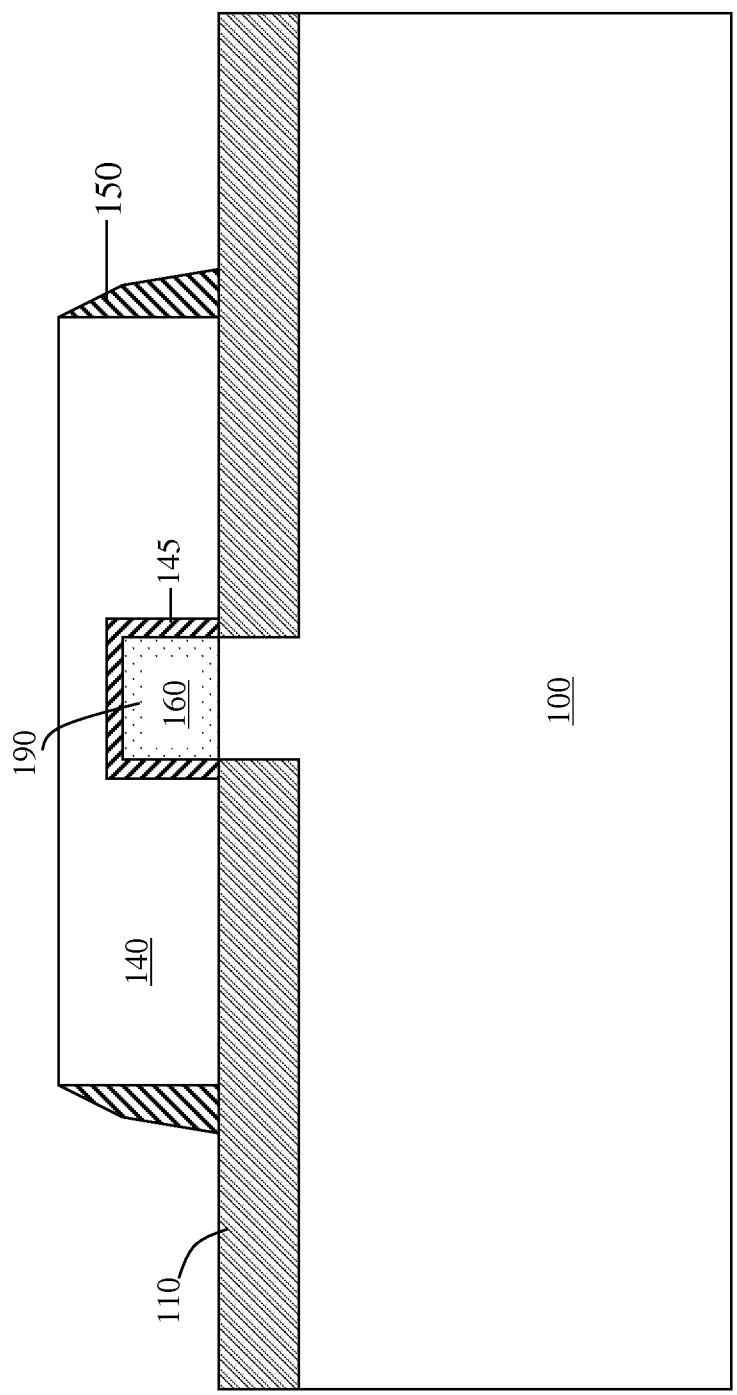
Figure 6D:
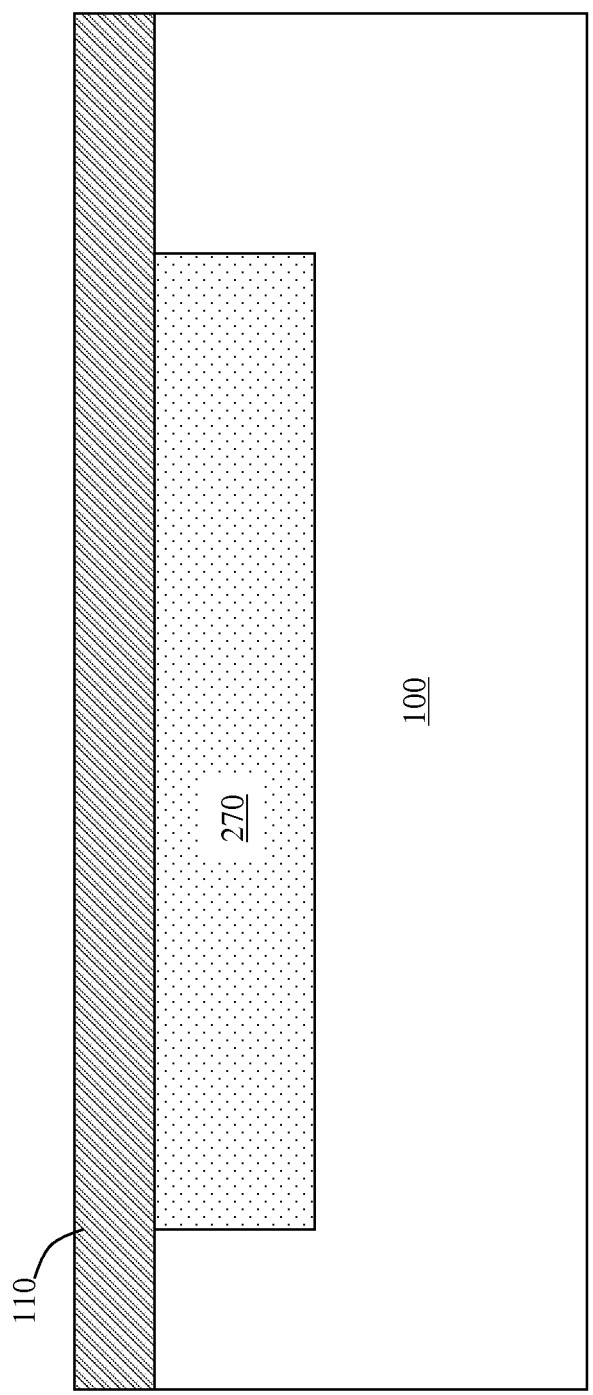

FIG. 6, which includes FIGS. 6a-6d, illustrates a bulk FINFET device in accordance with an embodiment of the invention, wherein FIG. 6a illustrates a top view and FIGS. 6b-6d illustrate cross sectional views.

Referring to FIG. 6a, a lateral fin 190 is disposed over a substrate 100. In one embodiment, the substrate 100 comprises a bulk substrate. The lateral fin 190 comprises a first width W1. A gate line 140 wraps around the lateral fin 190 (FIG. 6c).

The transistor 10 includes a source 120, a drain 130, channel 160, and source extension region 170 and drain extension region 180 as in prior embodiments. The lateral fin 190 couples the source 120 having the first doping type with the drain 130 having the first doping type through the channel 160 having a doping of the opposite second doping type.

As illustrated in the cross sectional view of FIG. 6b, one end of the lateral fin 190 is coupled to a top surface of a first well region 270 having a first doping type. A second top surface of the well region 270 is coupled to a bottom surface of the drain 130. The first and the second top surfaces of the well region 270 are separated by isolation 110 thereby increasing the effective length of the drain extension. Advantageously, the first well region 270 provides additional length for voltage potential reduction without increasing device area. For example, the length of the drain extension $L_{ext}$ is the sum of twice the depth of the isolation D and the length of the isolation (i.e. $L_{ext}=L_{210}+2D+L_{iso}$). In various embodiments, the depth of the isolation 110 may be tailored to modulate the voltage reduction action.

In one embodiment, the first lightly doped region 210, which has the same doping type as the first well region 270, of the lateral fin 190 may be doped to a different doping level from the first well region 270. In such an embodiment, the doping level varies abruptly at an interface between the first lightly doped region 210 and the first well region 270. Alternatively, the first lightly doped region 210 may be doped at the same time as the first well region 270 thereby having a continuous doping at an interface between the first lightly doped region 210 and the first well region 270. While the doping is continuous, the doping levels may still be different between the first lightly doped region 210 and the first well region 270.

The body of the transistor 10 is coupled to a body contact region 260 having the second doping type. In one embodiment, the body contact region 260 is separated from the source 120 by the isolation 110. The isolation 110 may be formed as a plurality of isolation trenches, although in other embodiments, other forms of isolation 110 may be used.

FIG. 7, which includes FIGS. 7a-7e, illustrates cross sectional views of a bulk FINFET device in accordance with embodiments of the invention.

Figure 7A:
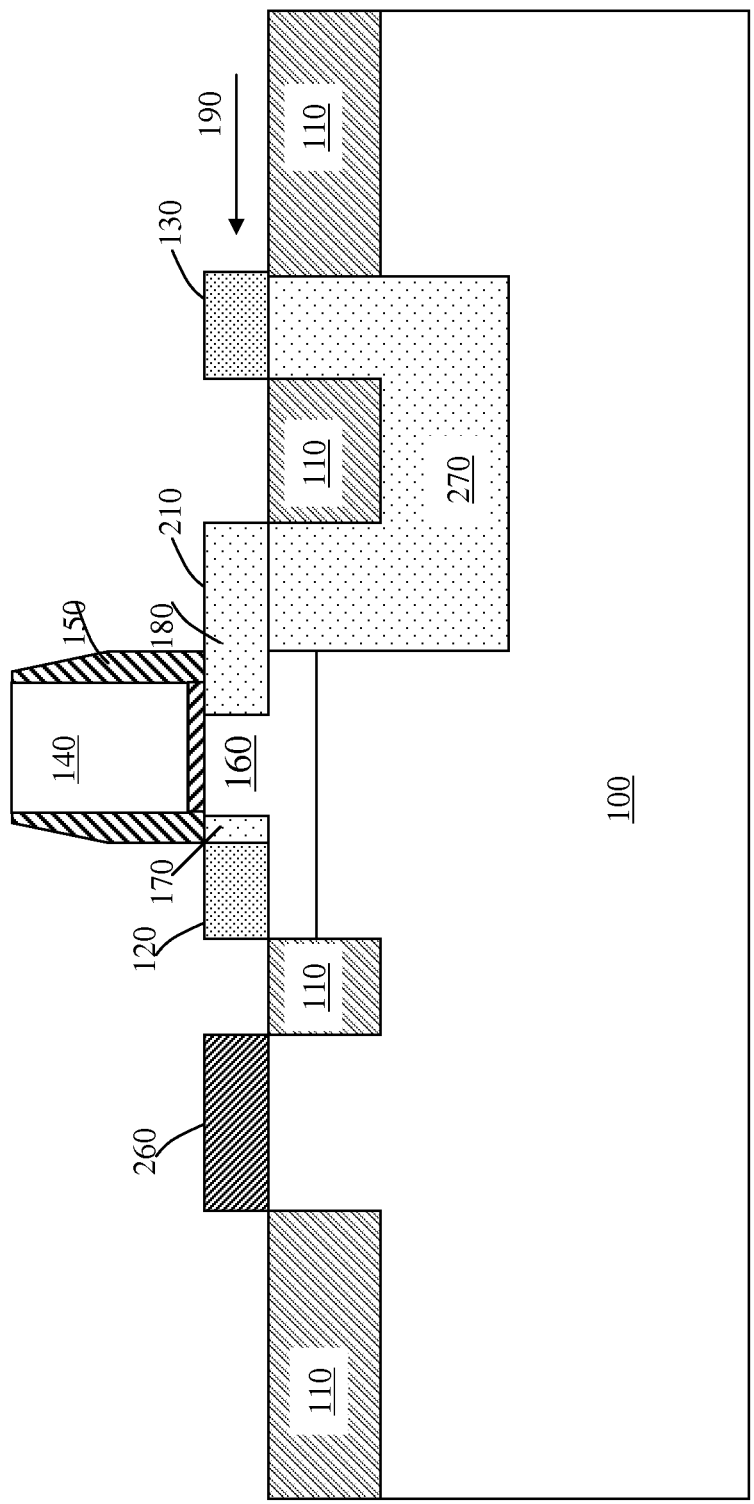
FIGS. 7a-7e, illustrates cross sectional views of a bulk FINFET device in accordance with embodiments of the invention.

Referring to FIG. 7a, unlike prior embodiment, the gate overlap over the source extension 170 and the drain extension region 180 is asymmetric. This helps to improve ON current by minimizing resistance of the drain extension region 180. This is because the surface of the drain extension region 180 under the gate line 140 is under accumulation. However, under the OFF state, the diode breakdown is not reduced, thereby providing better tradeoff between the ON current and diode breakdown & leakage.

Figure 7B:
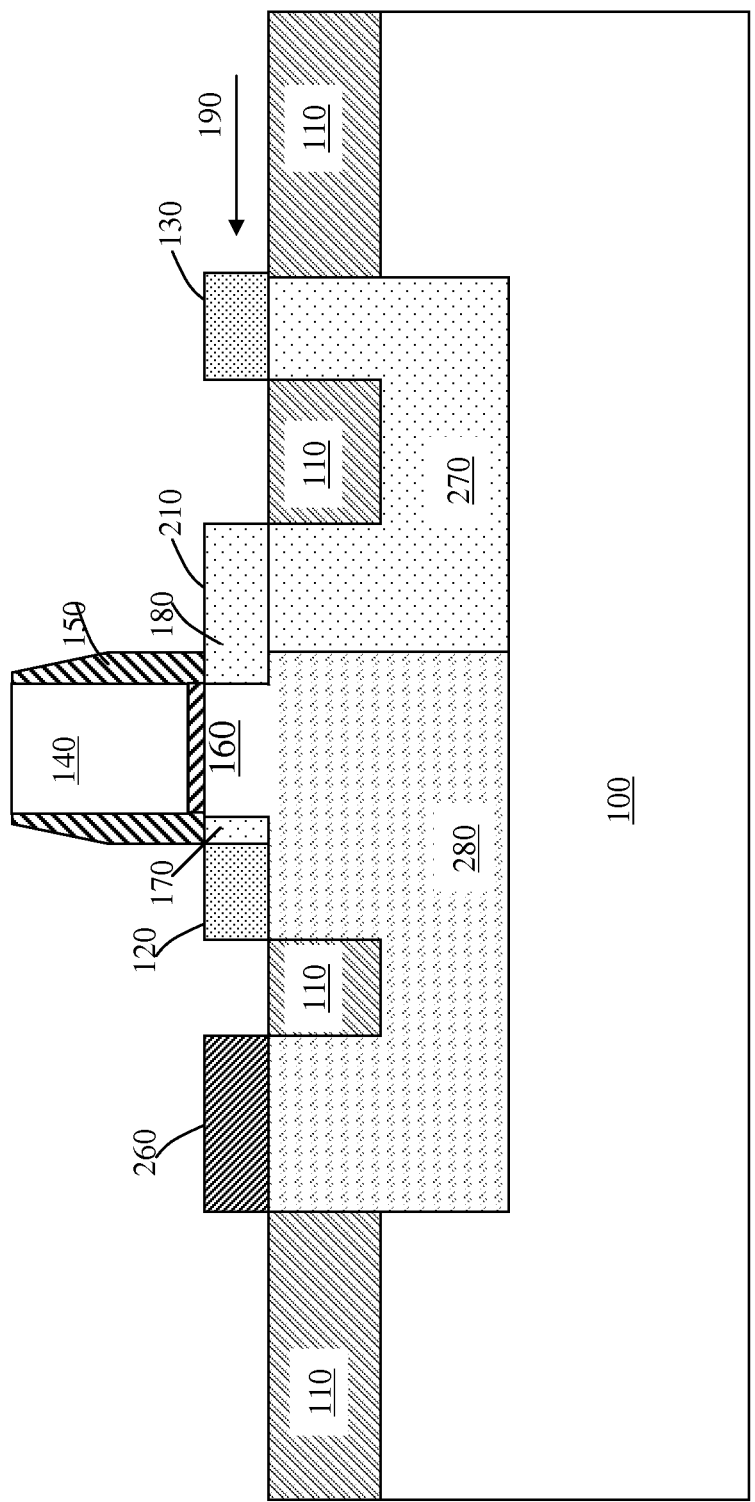

FIG. 7b illustrates an alternative embodiment including a second well region 280 having the second doping type. The second well region 280 may be formed before or after forming the first well region 270.

Figure 7C:
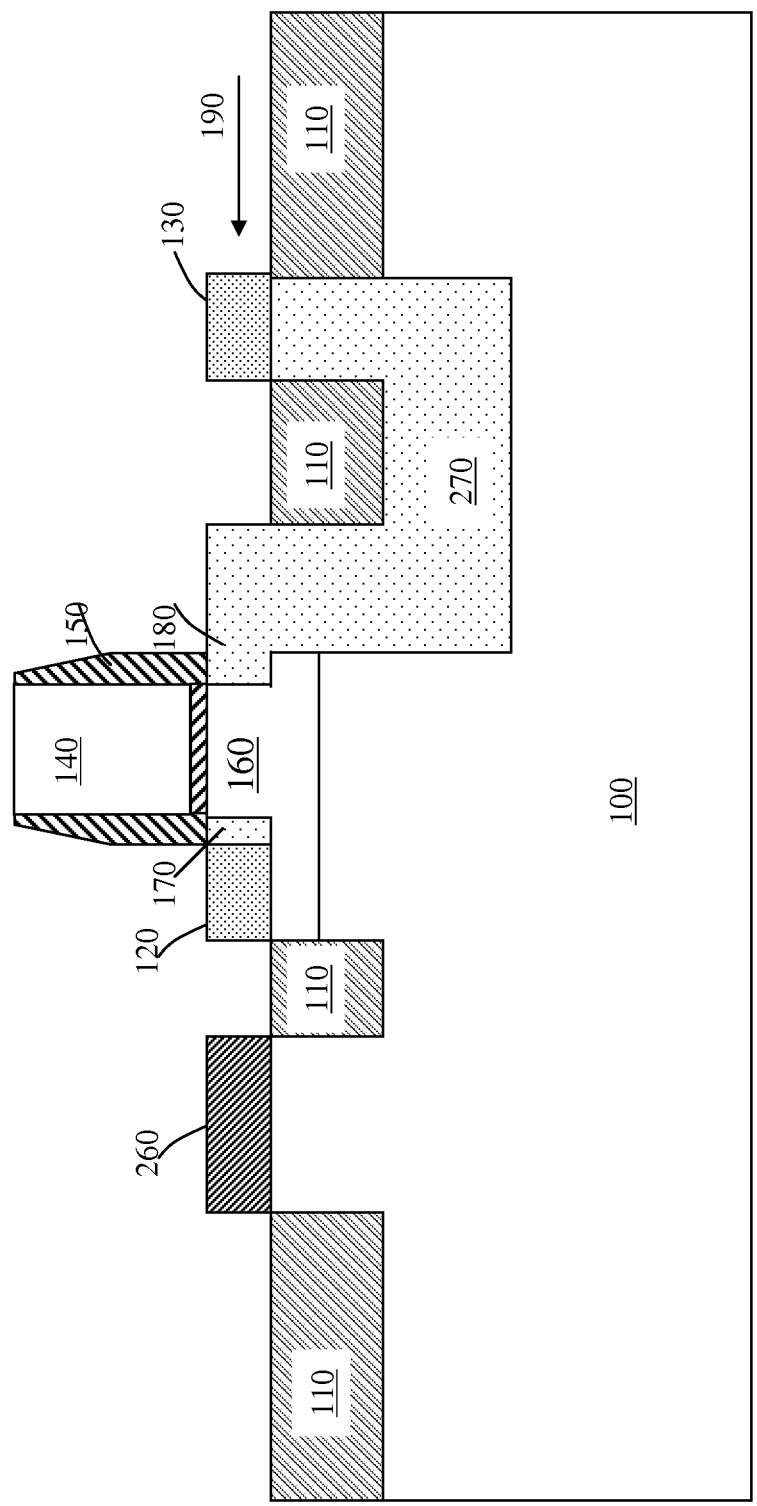

FIG. 7c illustrates an alternative embodiment wherein the drain extension region 180 of the lateral fin 190 is not doped separately. Therefore, the doping from the first well region 270 extends continuously (and without significant change) into the drain extension region 180 of the lateral fin 190. However, the doping in the first well region 270 and in the drain extension region 180 may be different. For example, if the first well region 270 and the drain extension region 180 are formed using a well implant, the doping changes with depth as a function of the implant energy and dose used.

Figure 7D:
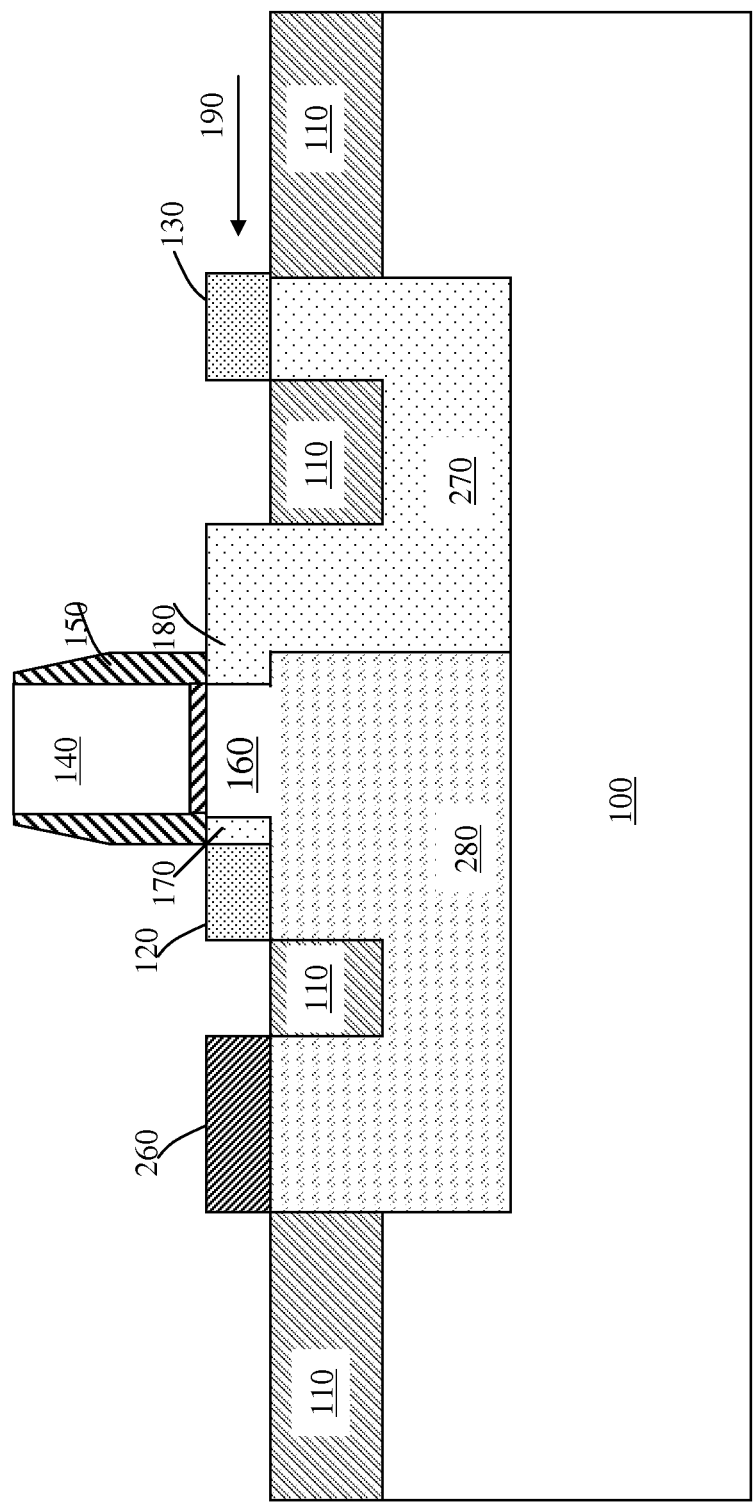

FIG. 7d illustrates an alternative embodiment that includes the embodiments of FIG. 7b (second well region 280) and FIG. 7c (continuous doping between the first well region 270 and the drain extension region 180).

Figure 7E:
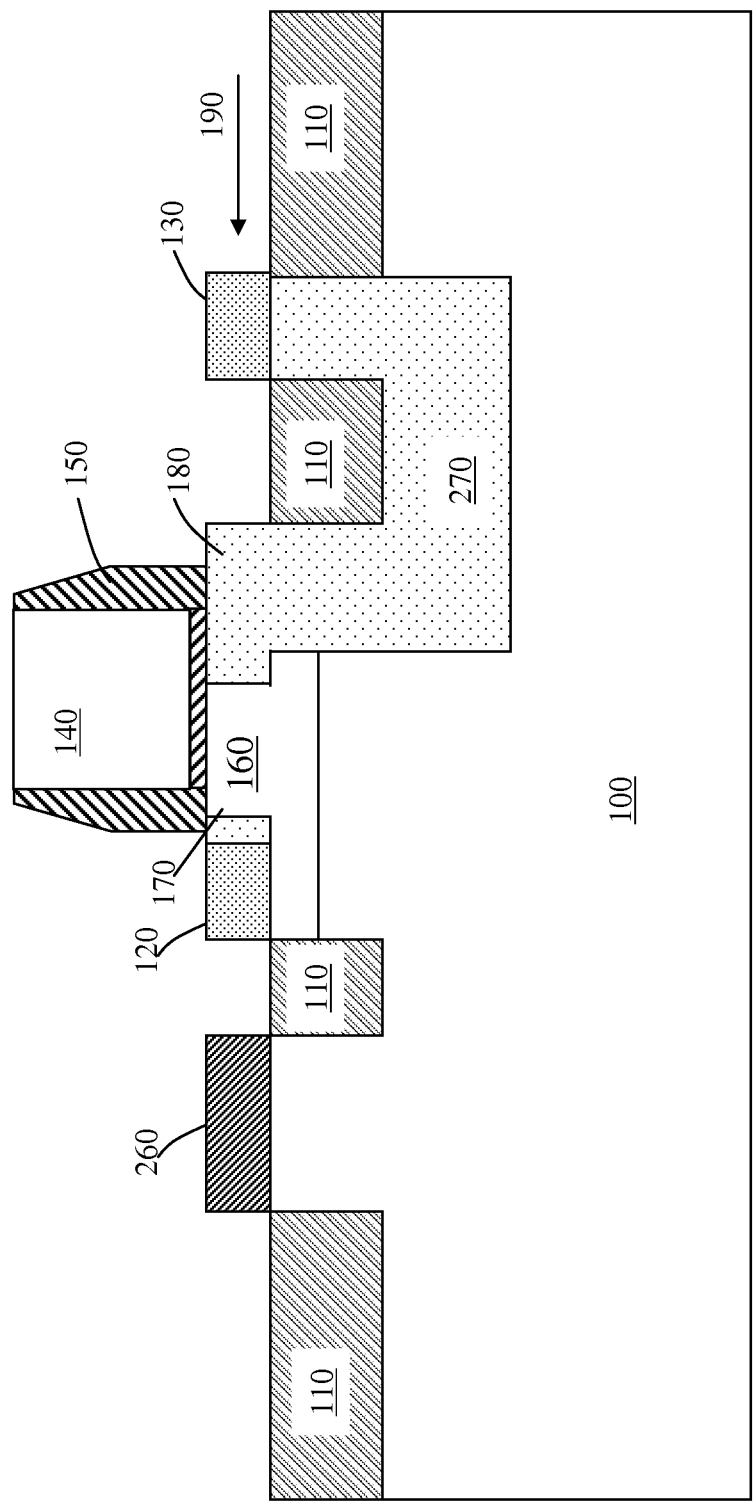

FIG. 7e illustrates an alternative embodiment that includes the embodiments of FIG. 7a (asymmetric gate overlap of the source extension region 170 and the drain extension region 180) and 7c (continuous doping between the first well region 270 and the drain extension region 180).

Figure 8A:
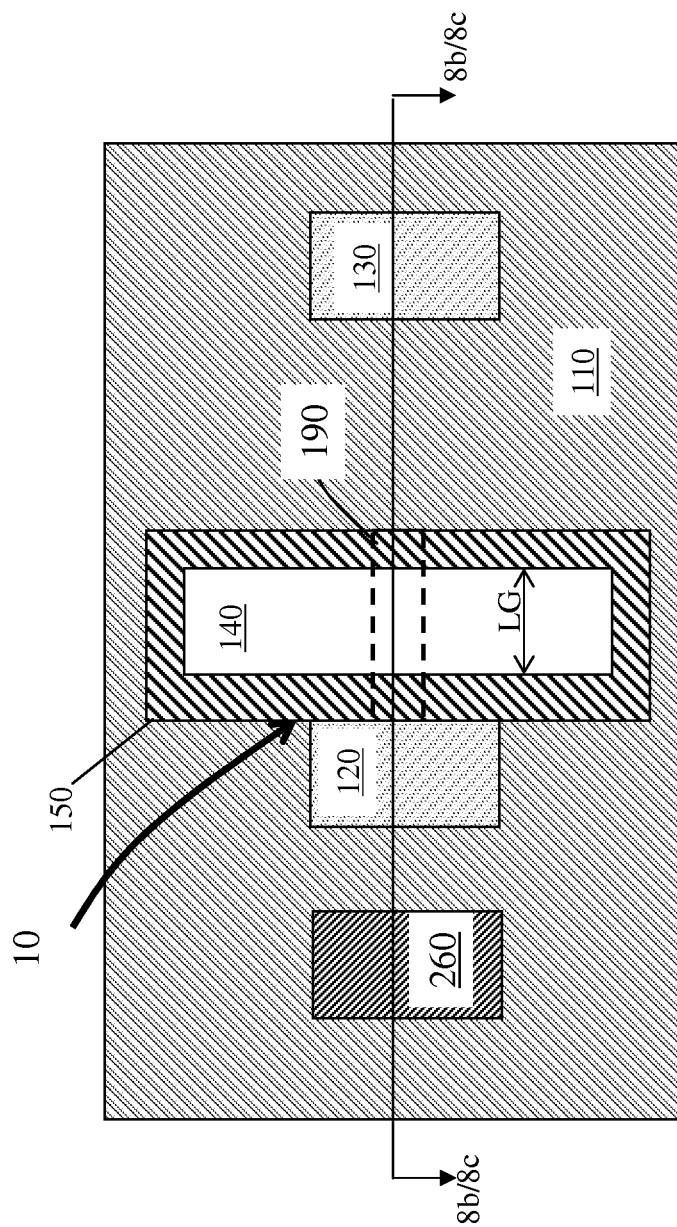
Figure 8B:
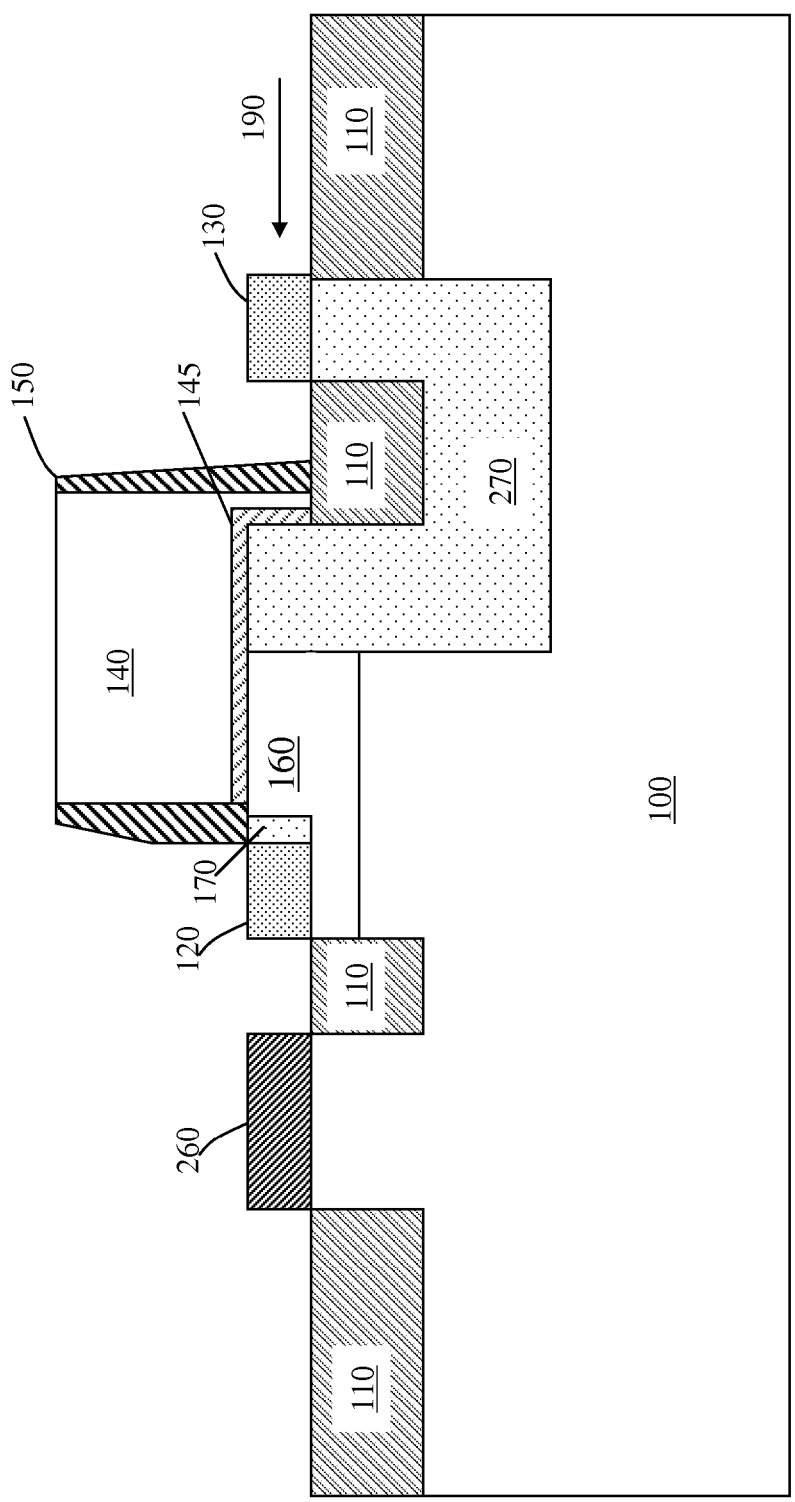
Figure 8C:
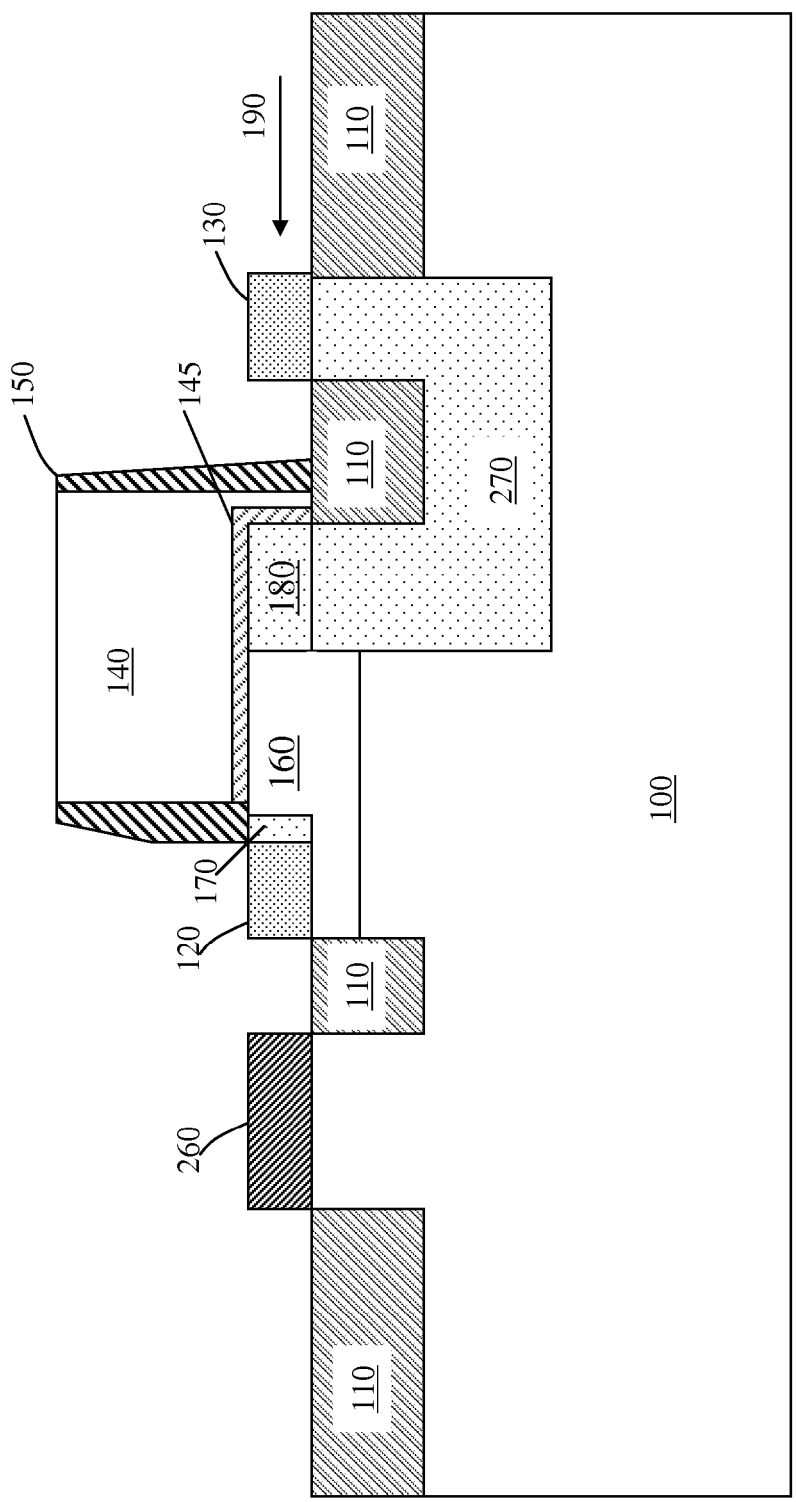

FIG. 8, which includes FIGS. 8a-8c, illustrates a bulk FINFET device in accordance with an alternative embodiment of the invention, wherein FIG. 8a illustrates a top view and FIGS. 8b and 8c illustrate alternative cross sectional views.

The bulk FINFET 10 illustrated in FIG. 8a includes a lateral fin 190. However, unlike prior embodiments, the gate line 140 completely wraps one sidewall of the fin (see FIG. 8b). This reduces the drain resistance further (as in FIG. 7a) while maintaining the diode breakdown voltage. Unlike FIG. 7a, the overlap with the gate line 140 is much more extensive.

The cross sectional view of FIG. 8b illustrates the gate dielectric 145 formed over a sidewall of the lateral fin 190. The gate line 140 is formed over the gate dielectric 145. The gate line 140 and the spacer 150 are formed over the isolation 110 between the first and the second top surfaces of the first well region 270.

FIG. 8c illustrates an alternative embodiment wherein the drain extension region 180 is doped different from the first well region 270.

Figure 9A:
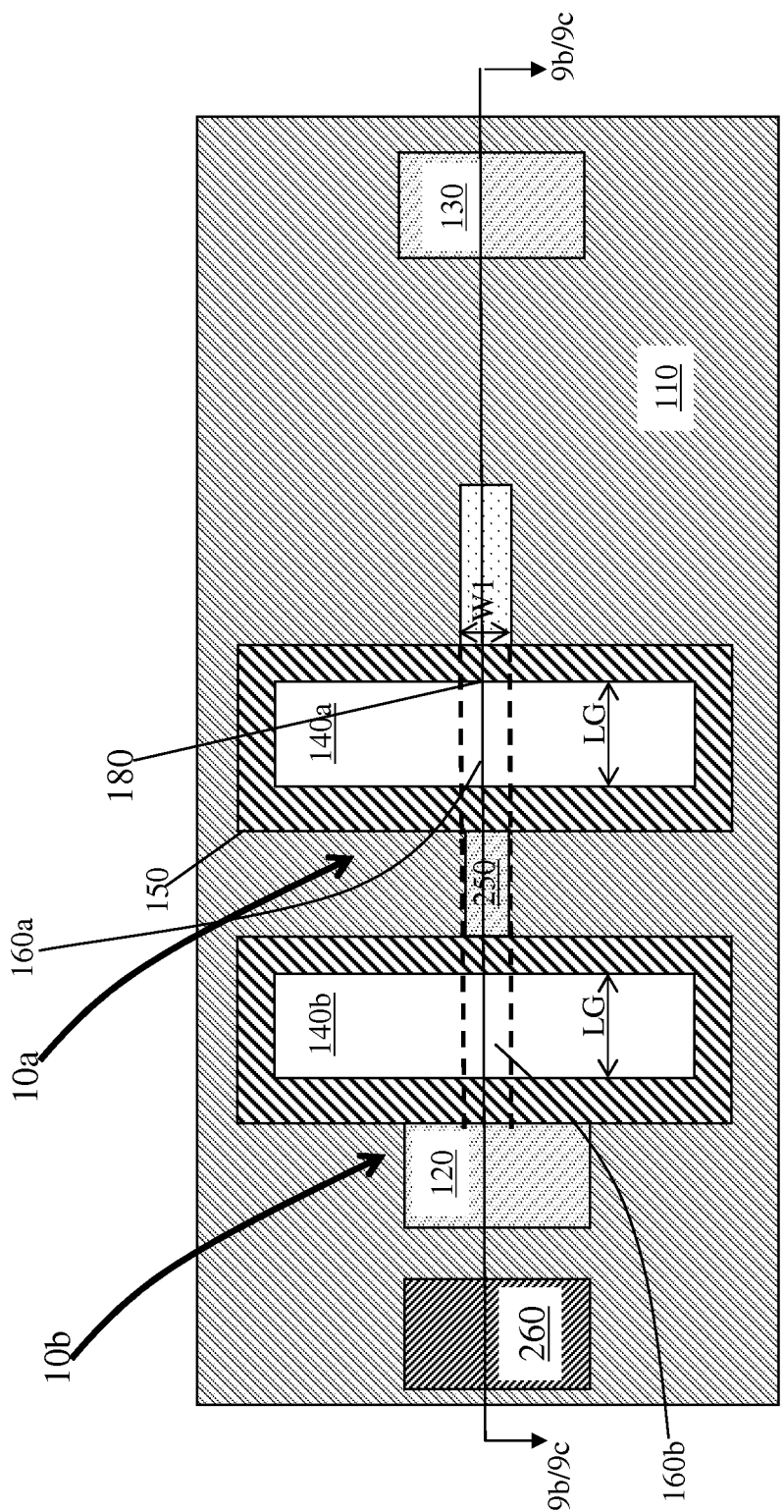
FIG. 9a illustrates a top view and FIGS. 9b and 9c illustrate alternative cross sectional views.
Figure 9B:
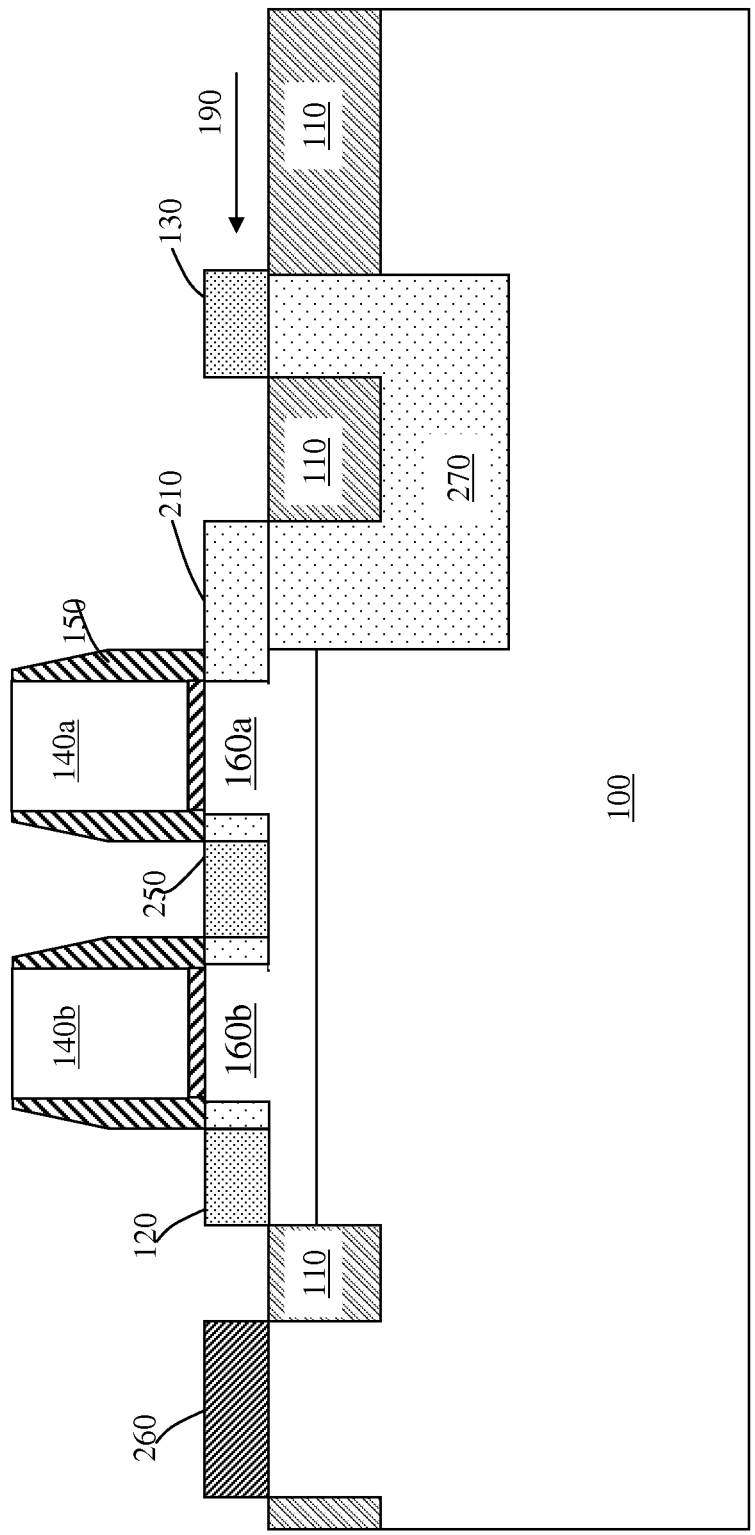
Figure 9C:
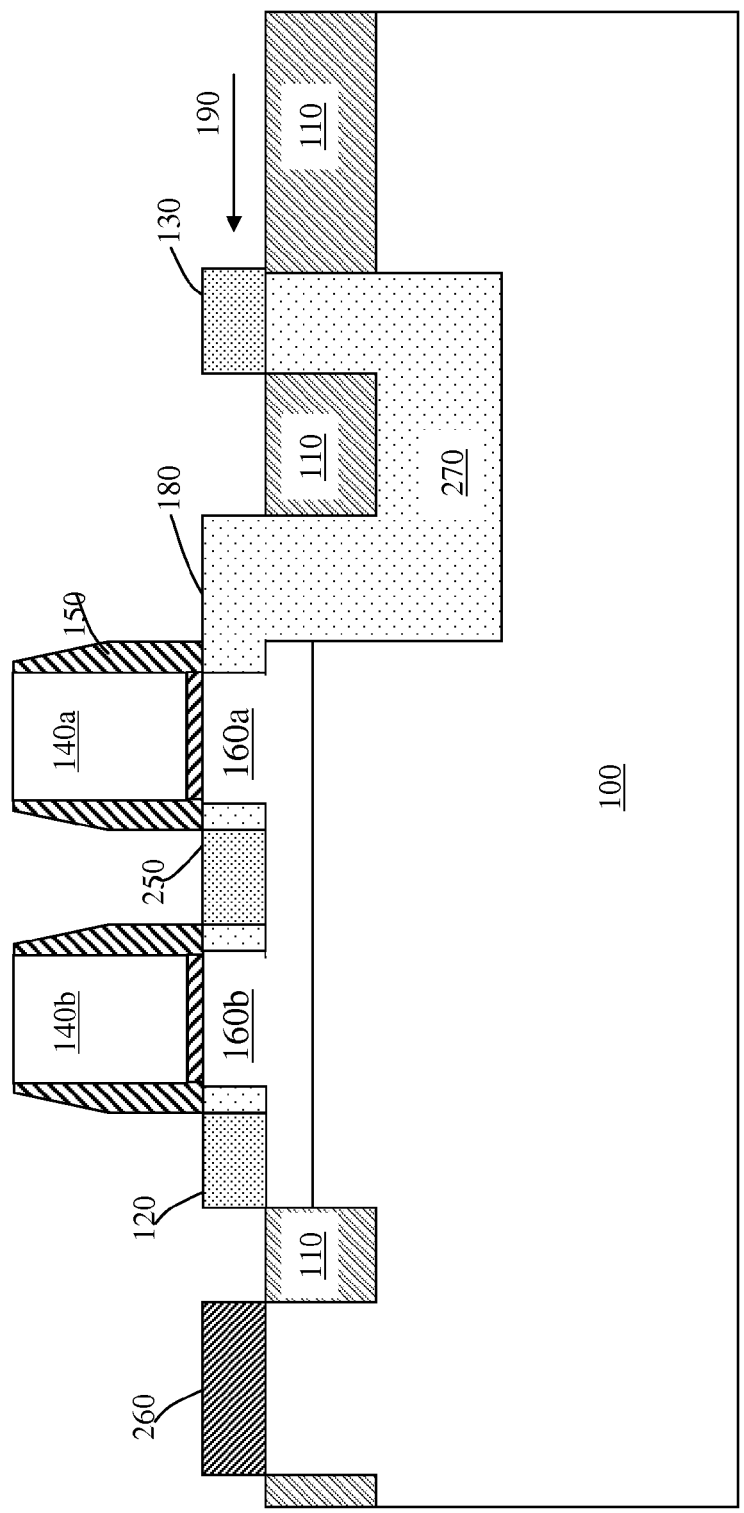

FIG. 9, which includes 9a-9c, illustrates a bulk FINFET having a plurality of gate lines in accordance with an embodiment of the invention, wherein FIG. 9a illustrates a top view and FIGS. 9b and 9c illustrate alternative cross sectional views.

Referring to FIG. 9a, first gate line 140a and a second gate line 140b form a first and a second transistor 10a and 10b having a first channel 160a and a second channel 160b. The first and the second transistors 10a and 10b have a common shared source/drain 250. The shared source/drain 250 is a drain for the second transistor 10b, and a source of the first transistor 10a. Because the potential at the drain of the first transistor 10a is already lowered by the potential reduction under the isolation 110 as described in prior embodiments, additional measures for potential reduction within the shared source/drain 250 are not required. The gate lengths LG of the both transistors may be different in alternative embodiments.

FIGS. 9b and 9c illustrate alternative embodiments, wherein FIG. 9b illustrates a separate doping of the first lightly doped region 210 and the first well region 270 while FIG. 9c illustrates a continuous doping between the drain extension region 180 and the first well region 270.

Figure 10A:
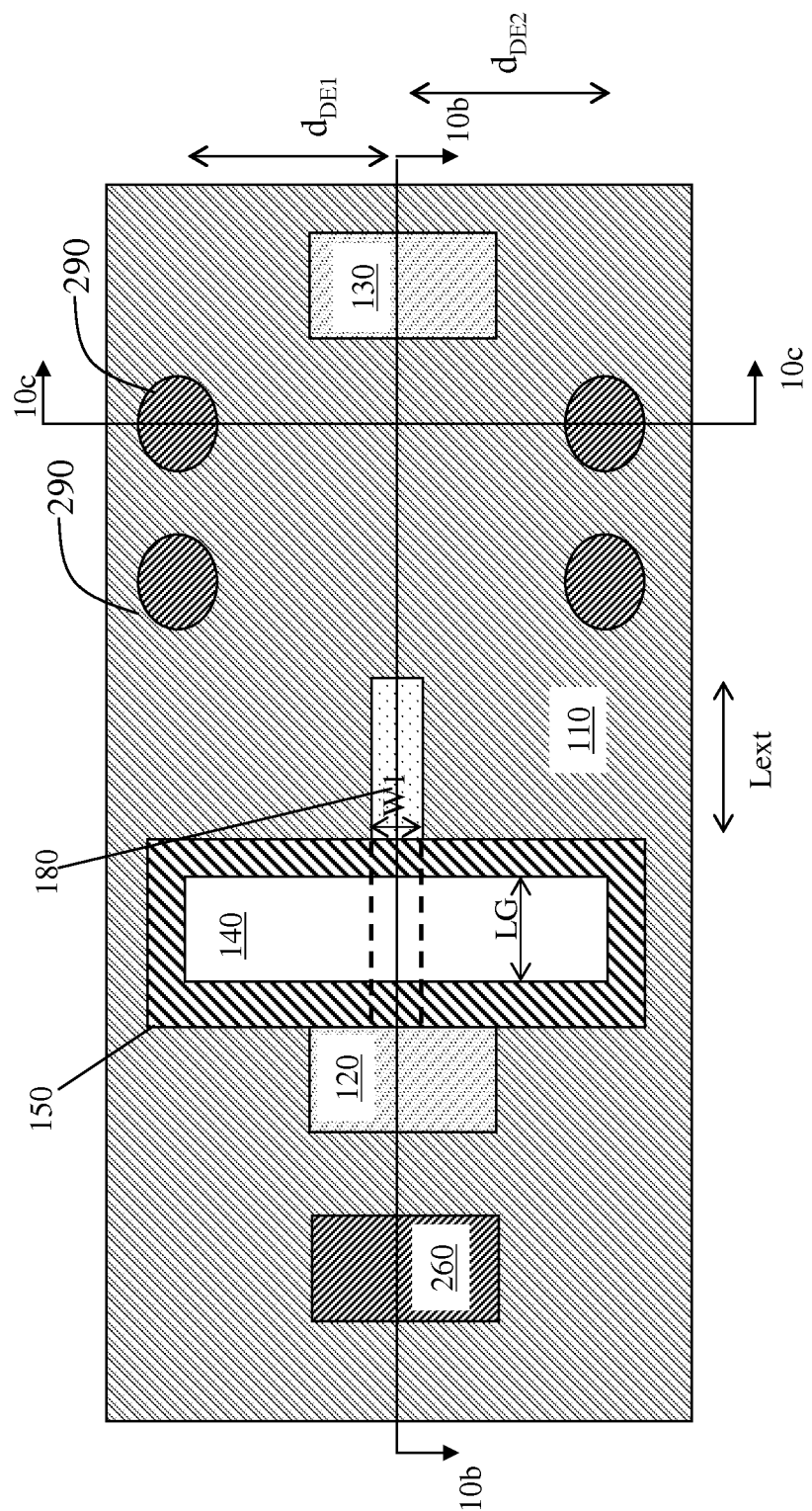
FIGS. 10a-10c, illustrates a bulk FINFET device in accordance with an alternative embodiment.
Figure 10B:
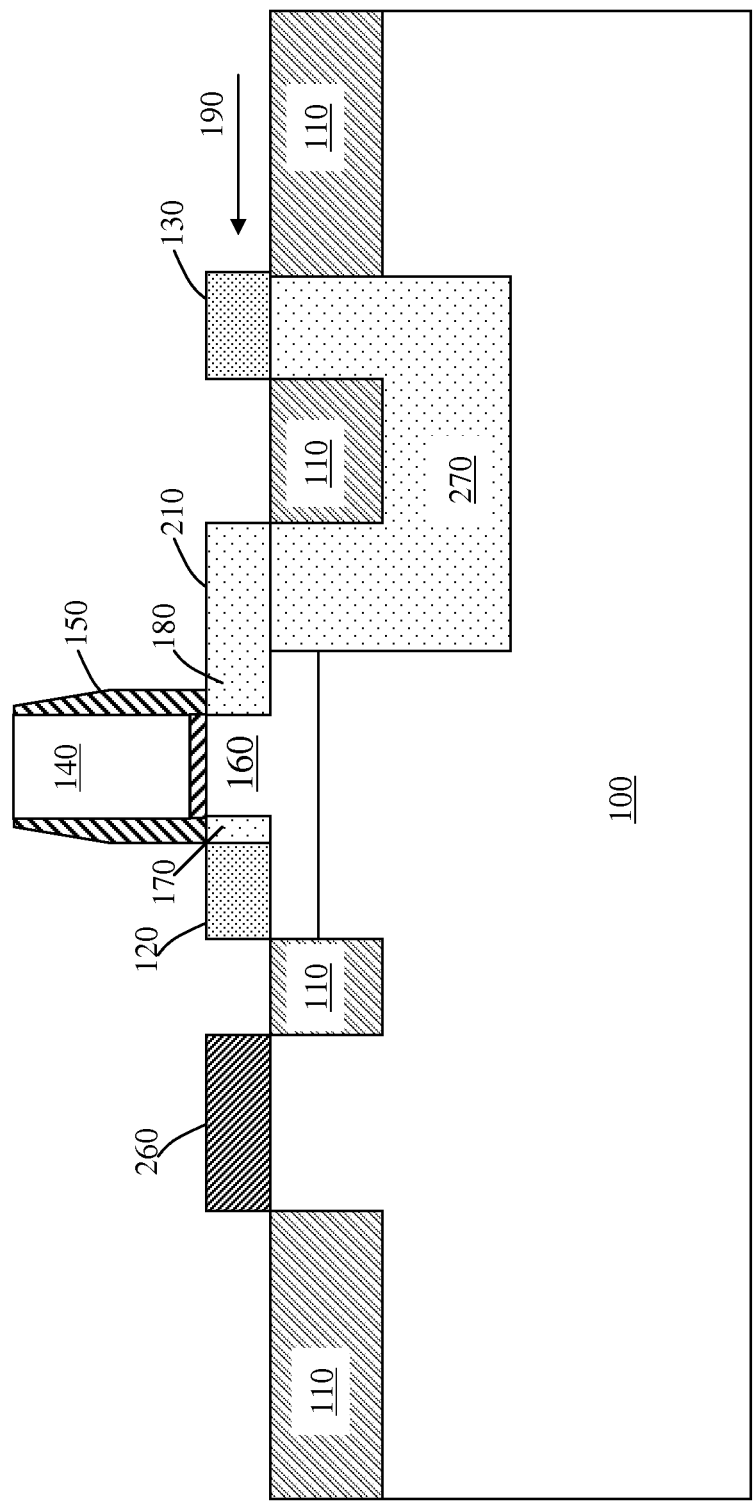
Figure 10C:
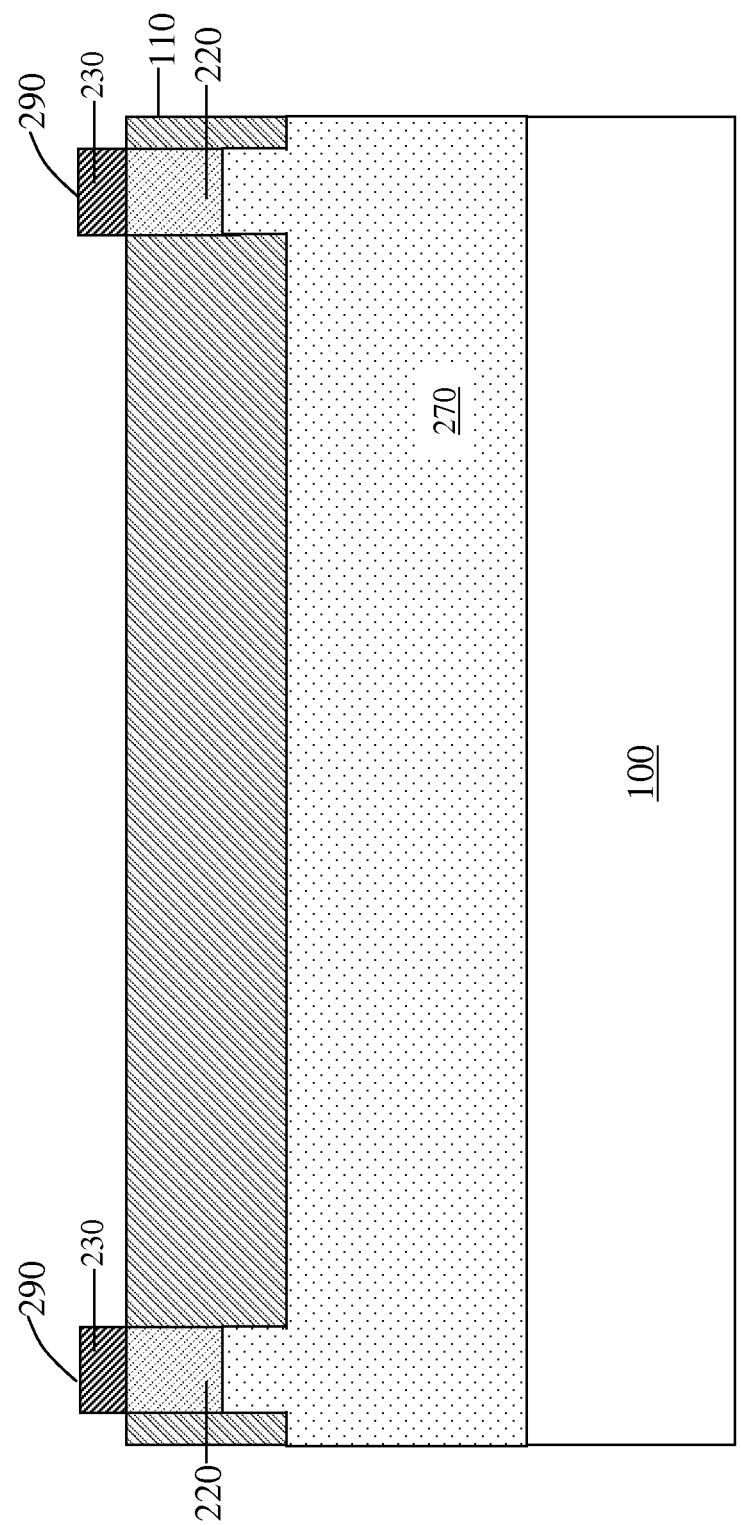

FIG. 10, which includes FIGS. 10a-10c, illustrates a bulk FINFET device in accordance with an alternative embodiment.

Referring to FIG. 10a, this embodiment is identical to embodiment described with respect to FIG. 6 except for additional drain extension (DE) contacts 290. Therefore, FIG. 10b is identical to FIG. 6b.

Referring to the cross sectional view of FIG. 10c, each of the DE contact 290 comprises a second lightly doped region 220 of the second doping type and a first heavily doped region 230 of the second doping type. The second lightly doped region 220 is optional and may be omitted in some embodiments. The first heavily doped region 230 is coupled to a low potential node and provides for increased charge depletion action of the well 270 thereby improving the breakdown voltage without decreasing the ON state performance, for example, as described with respect to FIG. 1. In various embodiments, the drain extension contacts 290 are placed away from the current path during the ON state so that the ON state performance is not impacted, for example, at a first distance $d_{DE1}$, and a second distance $d_{DE2}$.

In various embodiments, the drain extension contacts 290 are formed by forming openings that are filled with polysilicon, e.g., doped polysilicon. The doping of the polysilicon may be varied within the openings. Alternatively, epitaxial silicon may be grown to form the DE contacts 290.

Figure 11:
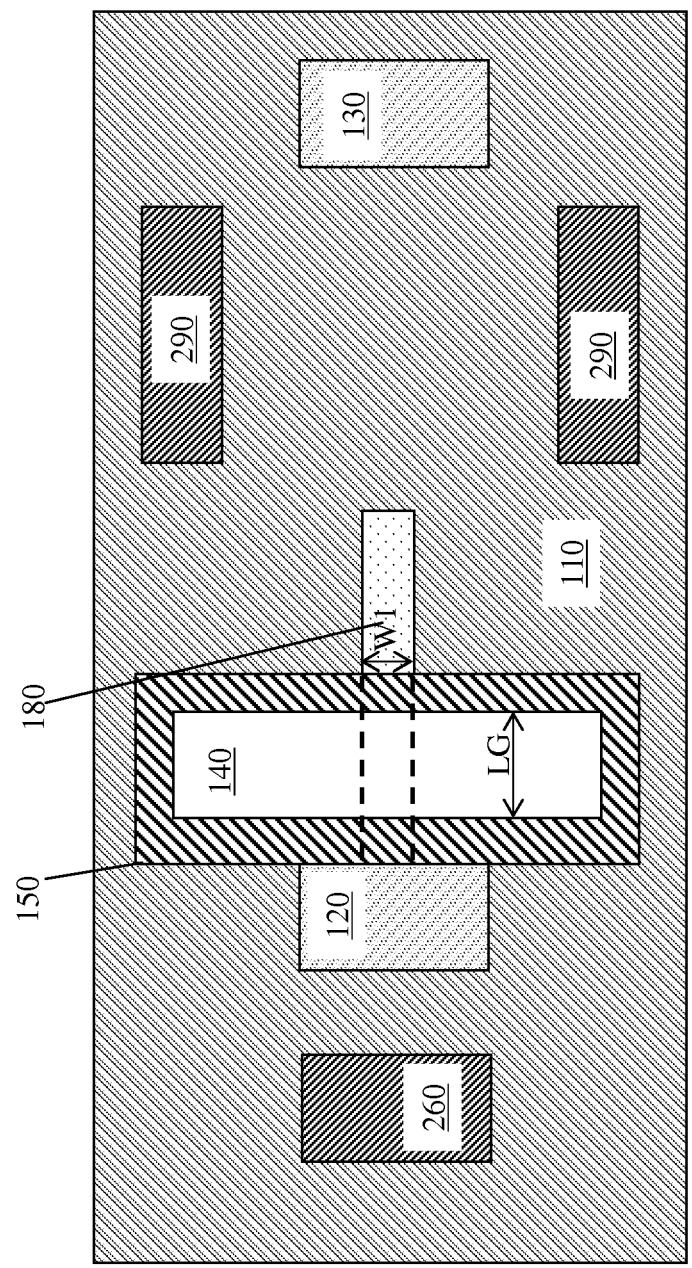
FIG. 11 illustrates a bulk FINFET device in accordance with an alternative embodiment.

FIG. 11 illustrates a bulk FINFET device in accordance with an alternative embodiment.

This embodiment is similar to the embodiment described with respect to FIG. 10. However, the drain extension contacts 290 are formed in a different shape and orientation. In one embodiment, the drain extension contacts 290 are formed as a rectilinear line.

Figure 12:
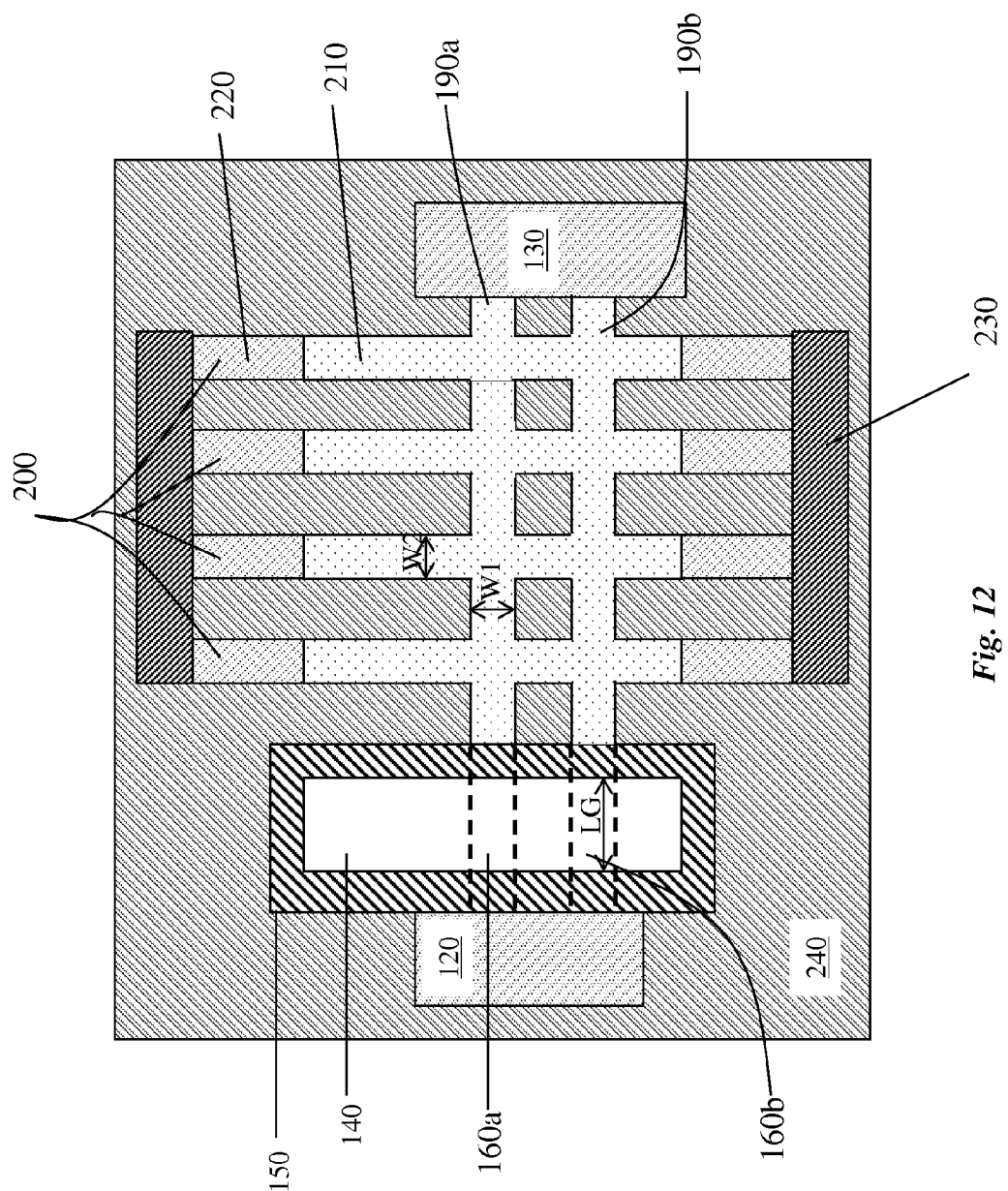
FIG. 12 illustrates a SOI FINFET device in accordance with an alternative embodiment.

FIG. 12 illustrates a SOI FINFET device in accordance with an alternative embodiment.

Referring to FIG. 12, the SOI FINFET device comprises two parallel lateral fins 190 (first lateral fin 190a and second lateral fin 190b) in one embodiment. In other embodiments, more number of fins may be used. The transistor includes shared region including a shared source 120 and a shared drain 130, a shared body contact region 260 with the first gate line 140 forming separate channels 160a and 160b for the transistors. Thus, in various embodiments, a common plurality of transverse fins 200 may be shared for both the transistors.

Figure 13:
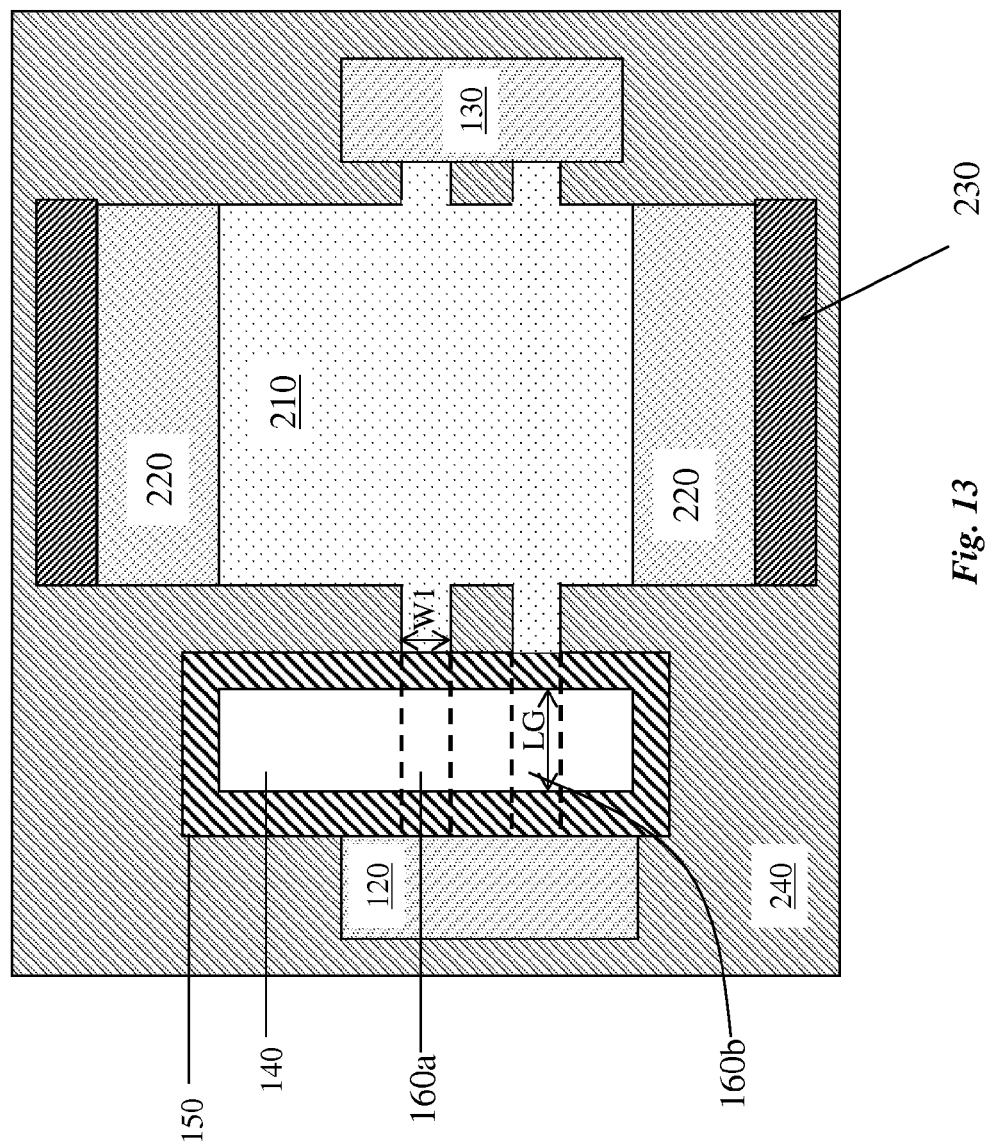
FIG. 13 illustrates a planar SOI device in accordance with an alternative embodiment.

FIG. 13 illustrates a planar SOI device in accordance with an alternative embodiment. FIG. 13 illustrates an embodiment similar to FIG. 12 for a planar SOI device.

Figure 14:
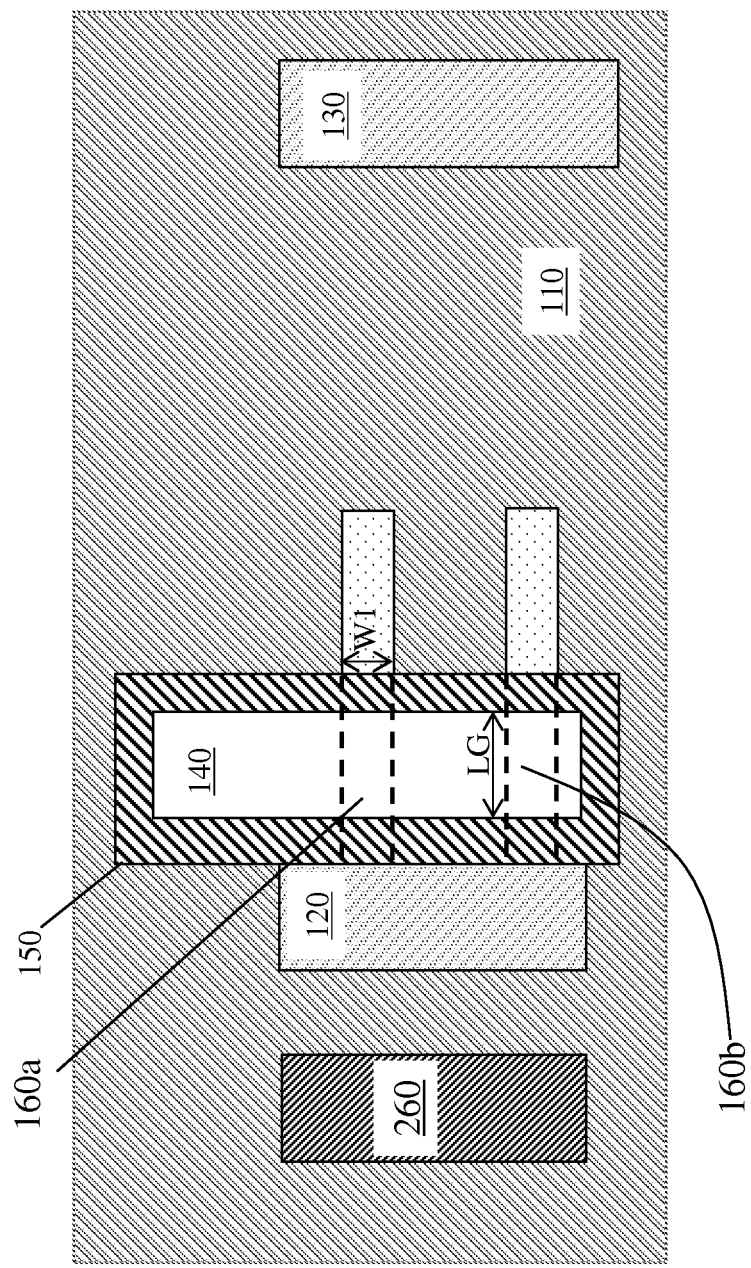
FIG. 14 illustrates a bulk FINFET device in accordance with an alternative embodiment.

FIG. 14 illustrates a bulk FINFET device in accordance with an alternative embodiment. FIG. 14 illustrates multiple fins parallel to the lateral fin, each of the multiple fins sharing a common first well region 270 (as illustrated e.g. in FIGS. 10b and 10c). Using a common structure for a plurality of transistors improves areal density (number of transistors per chip surface area).

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a first source of a first doping type disposed in or above a substrate;
   a first drain of the first doping type disposed in or above the substrate;
   a first fin disposed between the first source and the first drain;
   a first gate disposed over the first fin; and
   a second fin oriented in a direction different from the first fin, wherein, along a current path between the first source to the first drain, the second fin intersects a region of the first fin between the first gate and the first drain, wherein the first source, the first drain, the first fin, the first gate, and the second fin are different regions of a common transistor.

2. The device of claim 1, wherein the substrate is a semiconductor on insulator substrate comprising a semiconductor layer and an insulator layer over a bulk substrate.

3. The device of claim 1, wherein the first fin comprises a first p/n junction at the first source and a second p/n junction at the first drain, wherein the second fin comprises a p/n junction between a region of the first doping type and a region of an opposite second doping type.

4. The device of claim 1, wherein the first fin comprises a first portion of the first doping type disposed between the first gate and the first drain.

5. The device of claim 4, wherein the second fin comprises a first portion of the first doping type and a remaining portion of a second doping type, the second doping type being opposite to the first doping type, and wherein the first portion of the second fin intersects with the first portion of the first fin.

6. The device of claim 4, wherein the first fin further comprises a second portion of a second doping type disposed under the first gate, and a third portion of the first doping type disposed between the first gate and the first source, wherein the second doping type is opposite to the first doping type.

7. The device of claim 1, wherein the first fin further comprises a first channel region, the first channel region being physically separate from the second fin.

8. The device of claim 1, further comprising:
   a second source of the first doping type disposed in or above the substrate;
   a second drain of the first doping type disposed in or above the substrate, wherein the first fin is further disposed between the second source and the second drain; and
   a second gate disposed over the first fin between the second source and the second drain, wherein the first source and the second drain share a common region.

9. The device of claim 1, wherein the second fin is oriented in a direction perpendicular to the first fin.

10. The device of claim 1, wherein the second fin comprises a first portion oriented perpendicular to the first fin and a second portion parallel to the first fin.

11. The device of claim 1, further comprising:
    a second source of a first doping type disposed in or above the substrate;
    a second drain of the first doping type disposed in or above the substrate;
    a third fin disposed between the second source and the second drain, wherein the first gate is disposed over the third fin; and
    the second fin intersecting a region of the third fin between the first gate and the second drain.

12. The device of claim 11, wherein the first and the second sources share a common region, and wherein the first and the second drains share a common region.

13. A semiconductor device comprising:
    a first source of a first doping type disposed in or above a substrate;
    a first drain of the first doping type disposed in or above the substrate;
    a first gate disposed between the first source and the first drain;
    a first channel disposed under the first gate, the first channel comprising a second doping type;
    a first extension region of the first doping type proximate the first drain; and
    a first doped region having a second doping type disposed in or above the substrate, the second doping type being opposite to the first doping type, the first extension region contacting the first doped region, wherein the first doped region is separated from the first channel by the first extension region, wherein the first source, the first drain, the first gate, the first channel, the first extension region, and the first doped region are different regions of a common transistor.

14. The device of claim 13, wherein the first doped region is electrically coupled to a potential node that is lower with respect to a potential at the first drain and a potential at the first gate.

15. The device of claim 13, wherein the first doped region is a heavily doped region having a peak doping of at least $10^{19}$ cm$^{-3}$.

16. The device of claim 13, further comprising a second doped region of the second doping type contacting the first doped region, wherein the first doped region is between the second doped region and the first extension region, wherein the second doped region has a higher doping than the first doped region.

17. The device of claim 13, wherein the first channel region comprises a first width along a first direction perpendicular to a second direction from the first source and the first drain, wherein the first extension region comprises a first region having a first width and a second region having a second width, wherein the first region of the first extension region comprises the first width along the first direction, and wherein the second region of the first extension region comprises the second width along the second direction, the second width being larger than the first width.

18. The device of claim 13, further comprising a second extension region of the first doping type disposed between the first source and the first channel.

19. The device of claim 13, wherein the substrate is a semiconductor on insulation substrate comprising an insulator layer disposed between a semiconductor layer and a bulk substrate.

20. The device of claim 13, wherein the first extension region comprises:
a first fin oriented along a first direction; and
a second fin intersecting the first fin.

21. The device of claim 20, wherein the first extension region further comprises:
a third fin intersecting the second fin.

22. The device of claim 13, wherein the first extension region comprises:
a first fin oriented along a first direction; and
a plurality of second fins intersecting the first fin.

23. The device of claim 22, wherein a width of the first fin measured along a second direction perpendicular to the first direction is about the same as a width of each member of the plurality of second fins measured along the first direction.

24. The device of claim 13, further comprising:
a second source of the first doping type disposed in or over the substrate;
a second drain of the first doping type disposed in or over the substrate, wherein a first fin is further disposed between the second source and the second drain; and
a second gate disposed over the first fin between the second source and the second drain, wherein the first source and the second drain share a common region.

25. The device of claim 13, further comprising:
a second source of the first doping type disposed in or over the substrate;
a second drain of the first doping type disposed in or over the substrate, wherein the first gate is disposed between the second source and the second drain;
a second channel disposed under the first gate; and
a second extension region of the first doping type proximate the second drain, the second extension region contacting the first extension region, wherein the first and the second sources share a common region, and wherein the first and the second drains share a common region.

26. The device of claim 13, wherein the semiconductor device is a planar device without any fins.

27. A semiconductor device comprising:
a first source of a first doping type disposed in or above a substrate;
a first drain of the first doping type disposed in or above the substrate;
a first fin disposed between the first source and the first drain, the first fin extending from the first source towards the first drain, the first fin comprising a first p/n junction proximate the first source and a second p/n junction proximate the first drain;
a first gate disposed over the first fin; and
a plurality of second fins oriented at an angle to the first fin, each of the plurality of second fins being parallel to the others of the plurality of second fin, and intersecting a different region of the first fin between the first gate and the first drain, wherein the first source, the first drain, the first fin, the first gate, and the plurality of second fins form part of a common transistor.

28. The device of claim 27, wherein each of the plurality of second fins includes a p/n junction disposed within.

29. The device of claim 27, wherein the first fin comprises a first portion of the first doping type disposed between the first gate and the first drain.

30. The device of claim 29, wherein each of the plurality of second fins comprises a first portion of the first doping type and a remaining portion of a second doping type, the second doping type being opposite to the first doping type, and wherein the first portion of the second fin intersects with the first portion of the first fin.

* * * * *

UNITED STATES PATENT AND TRADEMARK OFFICE
CERTIFICATE OF CORRECTION

PATENT NO. : 9,455,275 B2  
APPLICATION NO. : 14/168978  
DATED : September 27, 2016  
INVENTOR(S) : Mayank Shrivastava It is certified that error appears in the above-identified patent and that said Letters Patent is hereby corrected as shown below:

On the Title Page

Item (73) Assignee, Line 1, delete "Techologies" and insert --Technologies--.

Signed and Sealed this
Seventeenth Day of January, 2017

Michelle K. Lee
*Director of the United States Patent and Trademark Office*